(12) United States Patent
Heun et al.

(10) Patent No.: US 8,557,953 B2
(45) Date of Patent: Oct. 15, 2013

(54) POLYMERS COMPRISING SUBSTITUTED ANTHRACENYL UNITS, BLENDS COMPRISING THESE POLYMERS, AND DEVICES COMPRISING THESE POLYMERS OR BLENDS

(75) Inventors: Susanne Heun, Bad Soden (DE); Niels Schulte, Kelkheim (DE); Rémi Manouk Anémian, Frankfurt (DE); Aurélie Ludemann, Frankfurt am Main (DE)

(73) Assignee: Merck Patent GmbH (DE)

( * ) Notice: Subject to any disclaimer, the term of this patent is extended or adjusted under 35 U.S.C. 154(b) by 57 days.

(21) Appl. No.: 13/379,385

(22) PCT Filed: May 28, 2010

(86) PCT No.: PCT/EP2010/003283
§ 371 (c)(1),
(2), (4) Date: Dec. 20, 2011

(87) PCT Pub. No.: WO2010/149258
PCT Pub. Date: Dec. 29, 2010

(65) Prior Publication Data
US 2012/0108731 A1      May 3, 2012

(30) Foreign Application Priority Data

Jun. 26, 2009   (DE) .................... 10 2009 030 847

(51) Int. Cl.
*C08G 61/00*      (2006.01)
*C08G 79/02*      (2006.01)

(52) U.S. Cl.
USPC ...................................................... 528/397

(58) Field of Classification Search
USPC ...................................................... 528/397
See application file for complete search history.

(56) References Cited

U.S. PATENT DOCUMENTS

| | | |
|---|---|---|
| 2004/0133004 A1 | 7/2004 | Stossel et al. |
| 2004/0135131 A1 | 7/2004 | Treacher et al. |
| 2004/0138455 A1 | 7/2004 | Stossel et al. |
| 2004/0206939 A1 | 10/2004 | Spreitzer et al. |
| 2004/0225056 A1 | 11/2004 | Spreitzer et al. |
| 2004/0260090 A1 | 12/2004 | Treacher et al. |
| 2006/0058494 A1 | 3/2006 | Busing et al. |
| 2006/0127696 A1 | 6/2006 | Stossel et al. |
| 2006/0175958 A1 | 8/2006 | Gerhard et al. |
| 2006/0284140 A1 | 12/2006 | Breuning et al. |
| 2007/0060736 A1 | 3/2007 | Becker et al. |
| 2007/0135635 A1 | 6/2007 | Stossel et al. |
| 2007/0252138 A1 | 11/2007 | Li et al. |
| 2009/0134384 A1 | 5/2009 | Stoessel et al. |
| 2010/0102305 A1 | 4/2010 | Heun et al. |
| 2011/0068304 A1 | 3/2011 | Parham et al. |
| 2012/0302717 A1* | 11/2012 | Zhou et al. ................ 528/8 |

FOREIGN PATENT DOCUMENTS

| | | |
|---|---|---|
| EP | 0681019 A2 | 11/1995 |
| EP | 1 239 526 A2 | 9/2002 |
| EP | 1288276 A1 | 3/2003 |
| GB | 2340304 A | 2/2000 |
| WO | WO-90/13148 A1 | 11/1990 |
| WO | WO-0178162 A2 | 10/2001 |
| WO | WO-02/068435 A1 | 9/2002 |
| WO | WO-02/072714 A1 | 9/2002 |
| WO | WO-02/077060 A1 | 10/2002 |
| WO | WO-02/081488 A1 | 10/2002 |
| WO | WO-03/019694 A2 | 3/2003 |
| WO | WO-03/048225 A2 | 6/2003 |
| WO | WO-2004/026886 A2 | 4/2004 |
| WO | WO-2004/037887 A2 | 5/2004 |
| WO | WO-2004/070772 A2 | 8/2004 |
| WO | WO-2004/113468 A1 | 12/2004 |
| WO | WO-2005/011013 A1 | 2/2005 |
| WO | WO-2005/014689 A2 | 2/2005 |
| WO | WO-2005/040302 A1 | 5/2005 |
| WO | WO-2005/042548 A1 | 5/2005 |
| WO | WO-2006/117052 A1 | 11/2006 |
| WO | WO-2008/011953 A1 | 1/2008 |

OTHER PUBLICATIONS

International Search Report for PCT/EP2010/003283, mailed Aug. 6, 2010.
Cui, W., et al., "The First Soluable Conjugated Poly(2,6-Anthrylene): Synthesis and Properties", Chemical Communications, vol. 8, (2008), pp. 1017-1019.
Hodge, P., et al., "Synthesis of Poly(Anthracene-2,6-diyl) and a Copolymer Containing Alternately Anthracene-2,6-diyl and P-Phenylene Units", Chemical Communications, vol. 1, (1997), pp. 73-74.
Jing Sun et al., "π-Conjugated poly(anthracene-alt-fluorene)s with X-shpaed repeating units: New blue-light emitting polymers", Polymer, vol. 49, pp. 2282-2287, 2008.

* cited by examiner

*Primary Examiner* — Terressa Boykin
(74) *Attorney, Agent, or Firm* — Novak Druce Connolly Bove + Quigg LLP

(57) ABSTRACT

The present invention relates to polymers comprising substituted anthracenyl units and to blends which comprise the polymers according to the invention. The invention is also directed to the use of the polymers and blends according to the invention in organic electronic devices and to these devices themselves.

17 Claims, 2 Drawing Sheets

POLYMERS COMPRISING SUBSTITUTED ANTHRACENYL UNITS, BLENDS COMPRISING THESE POLYMERS, AND DEVICES COMPRISING THESE POLYMERS OR BLENDS

CROSS-REFERENCE TO RELATED APPLICATIONS

This application is a national stage application (under 35 U.S.C. §371) of PCT/EP2010/003283, filed May 28, 2010, which claims benefit of German application 10 2009 030 847.4, filed Jun. 26, 2009.

BACKGROUND OF THE INVENTION

The present invention relates to polymers comprising substituted anthracenyl units and to blends which comprise the polymers according to the invention. The invention is also directed to the use of the polymers and blends according to the invention in organic electronic devices and to these devices themselves.

Electronic devices which comprise organic, organometallic and/or polymeric semiconductors are being used ever more frequently in commercial products or are just about to be introduced onto the market. Examples which may be mentioned here are charge-transport materials on an organic basis (for example hole transporters based on triarylamine) in photocopiers and organic or polymeric light-emitting diodes (OLEDs or PLEDs) in display devices or organic photoreceptors in copiers. Organic solar cells (O-SCs), organic field-effect transistors (O-FETs), organic thin-film transistors (O-TFTs), organic integrated circuits (O-ICs), organic optical amplifiers or organic laser diodes (O-lasers) are in an advanced stage of development and may achieve major importance in the future.

Many of these electronic devices have, irrespective of the respective application, the following general layer structure, which can be adapted for the respective application:
(1) substrate,
(2) electrode, frequently metallic or inorganic, but also comprising organic or polymeric conductive materials,
(3) charge-injection layer(s) or interlayer(s), for example for compensation of the unevenness of the electrode ("planarisation layer"), frequently comprising a conductive, doped polymer,
(4) organic semiconductor,
(5) optionally further charge-transport or charge-injection or charge-blocking layers,
(6) counterelectrode, materials as mentioned under (2),
(7) encapsulation.

The above arrangement represents the general structure of an organic electronic device, where various layers may be combined, meaning that in the simplest case an arrangement results from two electrodes, between which an organic layer is located. The organic layer in this case fulfils all functions, including the emission of light. A system of this type is described, for example, in WO 90/13148 A1 on the basis of poly(p-phenylenes).

This individual layer can be, for example, a copolymer, in which case the corresponding functional units are present in the main chain and/or side chain of the polymer, or it can be a polymer blend, in which case different polymers comprise one or more functional units as structural units. Mixtures of the two variants with functional small molecules are also known. However, all these simple single-layer devices exhibit advantages and disadvantages. A main problem is the operating voltage of such systems, which is still relatively high, inadequate efficiency and an inadequate lifetime.

Solution-processable polymers for OLEDs have caused a lot of excitement recently, in particular for a new generation of flat screens or as lighting element. Although constant improvements in polymer OLEDs have been achieved in recent years, they still exhibit deficits with respect to their efficiency and lifetime compared with vapour-deposited OLED devices, which usually consist of a multiplicity of specific functional layers. By contrast, the advantage of polymer OLEDs lies in simple processing from solution, where various layers can easily be produced by known coating methods (printing, spin coating). By contrast, small molecules have to be vapour-deposited in a vacuum chamber in a complex process.

Colour homogeneity is also in some cases very difficult to establish in the case of vapour-deposited small molecules, since small amounts of a dopant have to be dispensed accurately. In the case of copolymers, polymer blends or small molecules in solution, the requisite components, such as, for example, emitters or charge-transport units, can be dispensed very accurately in the correct concentration.

Many OLEDs in accordance with the prior art comprise an active polymer within a layer, where the polymer comprises all requisite functional units. This polymer layer is frequently applied to an interlayer, which is responsible, for example, for hole injection.

Polymer blends can also be employed and may be useful for various purposes, for example for white-emitting devices via a mixture of polymers emitting in different colours (turquoise and yellow, red, green and blue in increasing concentrations, for example GB 2340304), for improving hole injection in order to render an interlayer superfluous (for example WO 2008/011953), or in order to adapt the rheology by employing polymers having different properties.

BRIEF SUMMARY OF THE INVENTION

The object of the present invention was therefore the provision of compounds which, on use in organic electronic devices, cause a lower operating voltage, but at the same time have adequate stability and efficiency, irrespective of use as copolymer or polymer blend.

Surprisingly, it has been found that polymers which comprise structural units of the following formula (I) or polymer blends comprising polymers which comprise structural units of the following formula (I) result in a reduction in the operating voltage. This has been demonstrated both in the case of polymers and also in the case of polymer blends which comprise the polymers according to the invention. In addition, it has also been possible to increase the efficiency and lifetime of these systems.

For this purpose, the present invention provides a polymer comprising at least one structural unit of the general formula (I)

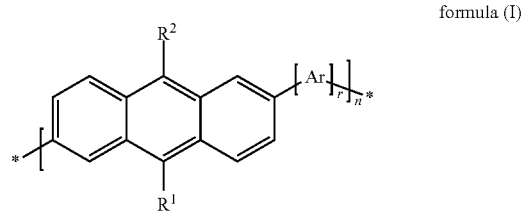

formula (I)

where the following applies to the symbols and indices used:

Ar is an aryl, aryloxy, heteroaryl or heteroaryloxy group or an aromatic or heteroaromatic ring system, $R^1$ and $R^2$ are each, independently of one another, $Ar^1$, H, D, F, Cl, Br, I, $N(Ar^2)_2$, $C(=O)Ar^2$, $P(=O)Ar^2_2$, $S(=O)Ar^2$, $S(=O)_2Ar^2$, $CR^3=CR^3Ar^2$, CN, $NO_2$, $Si(R^3)_3$, $B(OR^3)_2$, $OSO_2R^3$, a straight-chain alkyl, alkoxy or thioalkoxy group having 1 to 40 C atoms or a branched or cyclic alkyl, alkoxy or thioalkoxy group having 3 to 40 C atoms, each of which may be substituted by one or more radicals $R^3$, where one or more non-adjacent $CH_2$ groups may be replaced by $R^3C=CR^3$, $C\equiv C$, $Si(R^3)_2$, $Ge(R^3)_2$, $Sn(R^3)_2$, $C=O$, $C=S$, $C=Se$, $C=NR^3$, $P(=O)(R^3)$, SO, $SO_2$, $NR^3$, O, S or $CONR^3$ and where one or more H atoms may be replaced by F, Cl, Br, I, CN or $NO_2$, $Ar^1$ is selected on each occurrence, in each case independently of one another, from an aryl or heteroaryl group or an aromatic or heteroaromatic ring system, $Ar^2$ is an aryl, aryloxy, heteroaryl or heteroaryloxy group, $R^3$ is in each case, independently of one another, H or an aliphatic or aromatic hydrocarbon radical having 1 to 20 C atoms, where furthermore, if $R^1$ and $R^2$ both denote a radical $Ar^1$, the compound of the formula (I) is then selected from the structures of the formulae (Ia), (Ib), (Ic) and (Id):

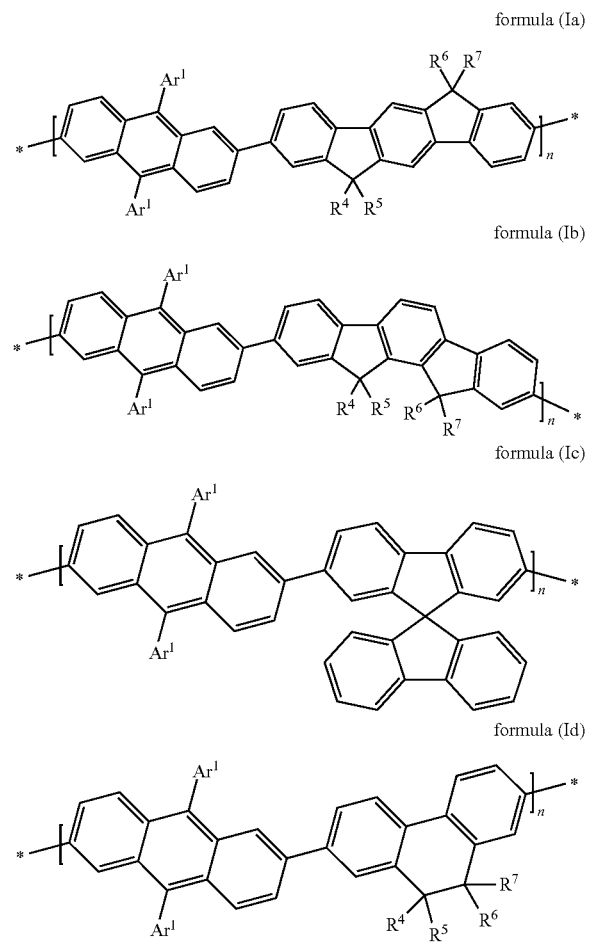

formula (Ia)

formula (Ib)

formula (Ic)

formula (Id)

where $Ar^1$ is on each occurrence identical or different, $R^4$, $R^5$, $R^6$ and $R^7$ each, independently of one another, have the meaning indicated for $R^1$, where $n \geq 1$ and $r=1$, and where the bonds denoted by an asterisk represent the bonds to the adjacent structural units in the polymer.

A BRIEF DESCRIPTION OF THE FIGURES

A DETAILED DESCRIPTION OF THE INVENTION

Figure 1:
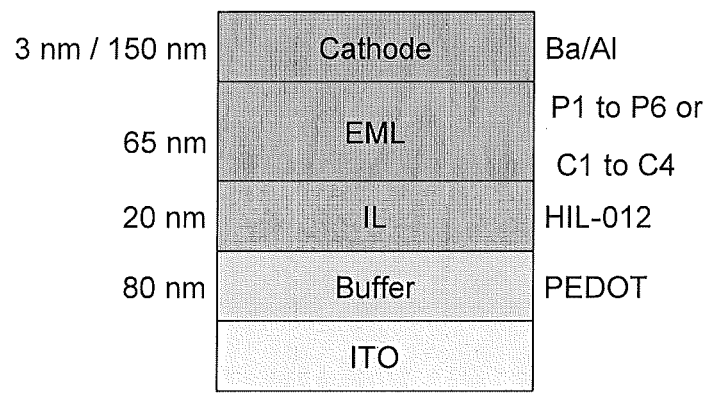
FIG. 1 illustrates a device for the production of polymeric organic light-emitting diodes.

The aromatic ring system in the sense of the present preferably contains 5 to 60 C atoms in the ring system. The heteroaromatic ring system in the sense of the present invention contains 2 to 60 C atoms and at least one heteroatom in the ring system, with the proviso that the sum of C atoms and heteroatoms is at least 5. The heteroatoms are preferably selected from Si, N, P, O, S and/or Se, particularly preferably selected from N, P, O and/or S. An aromatic or heteroaromatic ring system in the sense of the present invention is, in addition, intended to be taken to mean a system which does not necessarily contain only aryl or heteroaryl groups, but instead in which a plurality of aryl or heteroaryl groups may also be interrupted by a non-aromatic unit (preferably less than 10% of the atoms other than H), such as, for example, a C ($sp^3$-hybridised), N or O atom. Thus, for example, systems such as 9,9'-spirobifluorene, 9,9-diarylfluorene, triarylamine, diaryl ethers, stilbene, etc., are also intended to be taken to be aromatic ring systems in the sense of the present invention, as are systems in which two or more aryl groups are interrupted, for example, by a linear or cyclic alkyl group or by a silyl group. P=O or C=O groups are usually not conjugation-interrupting.

An aromatic or heteroaromatic ring system having 5 to 60 ring atoms, which may also in each case be substituted by any desired radicals R and which may be linked to the aromatic or heteroaromatic ring system via any desired positions, is taken to mean, in particular, groups derived from benzene, naphthalene, anthracene, phenanthrene, pyrene, chrysene, perylene, fluoranthene, naphthacene, pentacene, benzopyrene, biphenyl, biphenylene, terphenyl, terphenylene, fluorene, spirobifluorene, dihydrophenanthrene, dihydropyrene, tetrahydropyrene, cis- or trans-indenofluorene, truxene, isotruxene, spirotruxene, spiroisotruxene, furan, benzofuran, isobenzofuran, dibenzofuran, thiophene, benzothiophene, isobenzothiophene, dibenzothiophene, pyrrole, indole, isoindole, carbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalinimidazole, oxazole, benzoxazole, naphthoxazole, anthroxazole, phenanthroxazole, isoxazole, 1,2-thiazole, 1,3-thiazole, benzothiazole, pyridazine, benzopyridazine, pyrimidine, benzopyrimidine, quinoxaline, 1,5-diazaanthracene, 2,7-diazapyrene, 2,3-diazapyrene, 1,6-diazapyrene, 1,8-diazapyrene, 4,5-diazapyrene, 4,5,9,10-tetraazaperylene, pyrazine, phenazine, phenoxazine, phenothiazine, fluorubin, naphthyridine, azacarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine, benzothiadiazole, benzanthrene, benzanthracene, rubicene and triphenylene.

An aryl group in the sense of the present invention contains 5 to 60 C atoms; a heteroaryl group in the sense of the present invention contains 2 to 60 C atoms and at least one heteroatom, with the proviso that the sum of C atoms and heteroatoms is at least 5. The heteroatoms are preferably selected from Si, N, P, O; S and/or Se, particularly preferably selected from N, P, O or S. An aryl group or heteroaryl group here is taken to mean either a simple aromatic ring, i.e. benzene, or a simple heteroaromatic ring, for example pyridine, pyrimidine, thiophene, etc., or a condensed aryl or heteroaryl group, for example naphthalene, anthracene, phenanthrene, quinoline, isoquinoline, benzothiophene, benzofuran and indole, etc.

For the purposes of the present invention, an alkyl group having 1 to 40 C atoms, in which, in addition, individual H atoms or $CH_2$ groups may be substituted by the above-mentioned groups or radicals $R^1$ or $R^2$, is preferably taken to mean the radicals methyl, ethyl, n-propyl, i-propyl, cyclopropyl, n-butyl, i-butyl, s-butyl, t-butyl, cyclobutyl, 2-methylbutyl, n-pentyl, s-pentyl, cyclopentyl, n-hexyl, cyclohexyl, n-heptyl, cycloheptyl, n-octyl, cyclooctyl, 2-ethylhexyl, trifluoromethyl, pentafluoroethyl, 2,2,2-trifluoroethyl, ethenyl, propenyl, butenyl, pentenyl, cyclopentenyl, hexenyl, cyclohexenyl, heptenyl, cycloheptenyl, octenyl, cyclooctenyl, ethynyl, propynyl, butynyl, pentynyl, hexynyl and octynyl. An alkoxy group having 1 to 40 C atoms is preferably taken to mean methoxy, trifluoromethoxy, ethoxy, n-propoxy, i-propoxy, n-butoxy, i-butoxy, s-butoxy, t-butoxy or 2-methylbutoxy.

In an embodiment of the present invention, it is preferred, in the general formula (I), for at least one representative from $R^1$ and $R^2$ not to denote $Ar^1$ and for Ar to be selected from the following structural units:

(1)
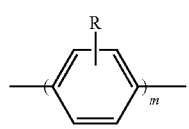

(2)
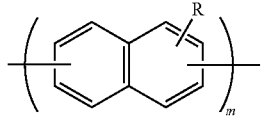

(3)
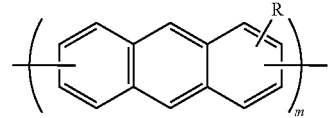

(4)
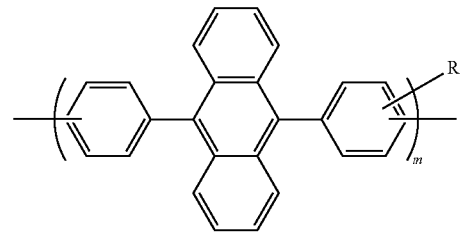

-continued (5)
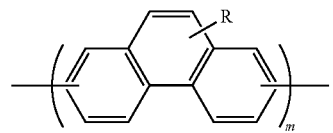

(6)
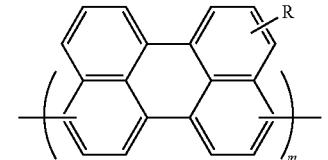

(7)
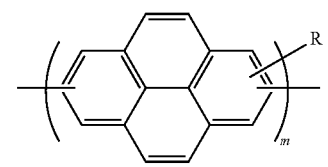

(8)
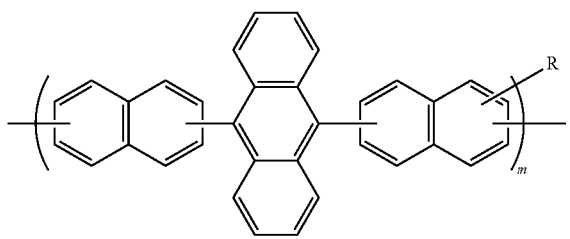

(9)
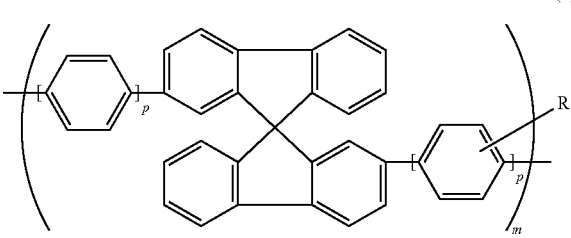

(10)
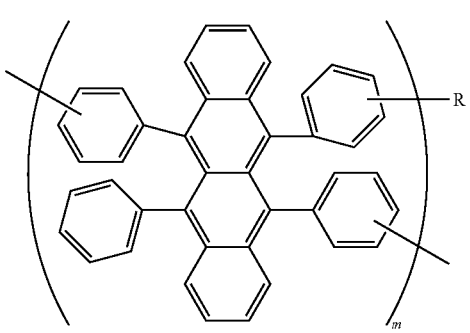

(11)
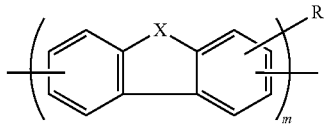

(12)
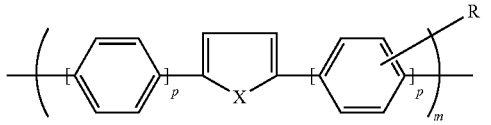

-continued

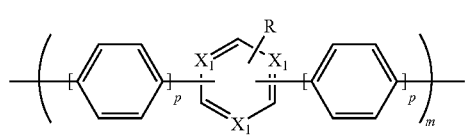
(13)

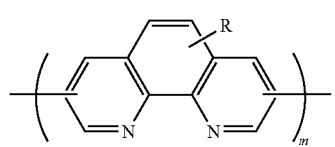
(14)

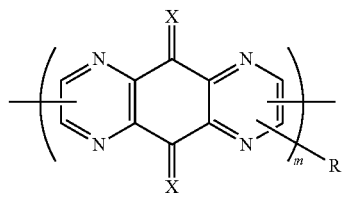
(15)

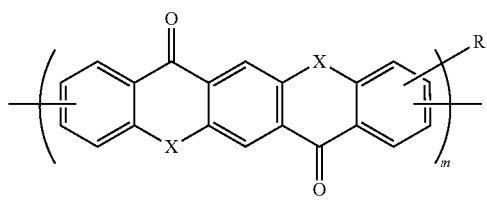
(16)

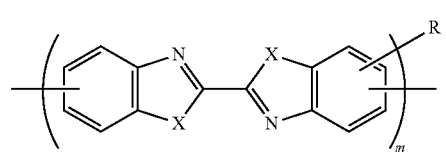
(17)

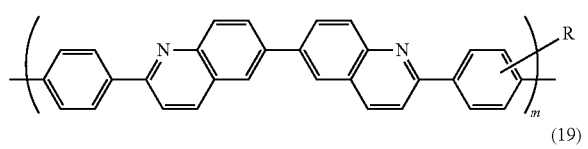
(18)

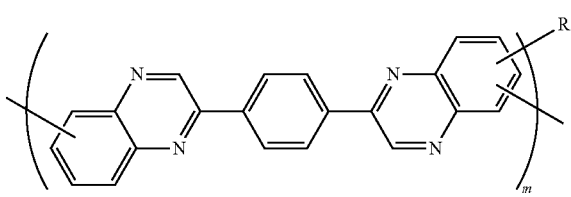
(19)

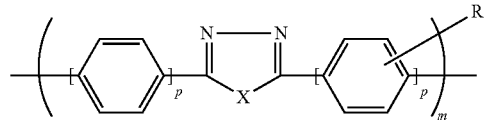
(20)

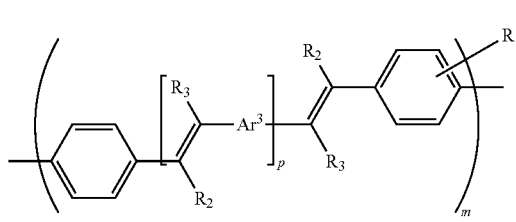
(21)

where R, $R_1$, $R_2$ and $R_3$ have the meanings indicated above for $R^1$ and $R^2$,
$Ar^3$ is an aromatic or heteroaromatic group, m is equal to 1 to 4, preferably 1 or 2, particularly preferably 1, p is, independently of one another, identically or differently, 0 to 2, X is equal to $NR^1$, O or S, and $X_1$ is equal to N or CH.

It is furthermore preferred for $Ar^1$ in the formula (I) to be selected on each occurrence, in each case independently of one another, from phenyl, naphthyl, anthracenyl, phenanthrenyl, pyrenyl, chrysenyl, perylenyl, fluoranthenyl, naphthacenyl, pentacenyl, benzopyrenyl, biphenyl, biphenylenyl, terphenyl, terphenylenyl, fluorenyl, spirobifluorenyl, dihydrophenanthrenyl, dihydropyrenyl, tetrahydropyrenyl, cis- or trans-indenofluorenyl, truxenyl, isotruxenyl, spirotruxenyl, spiroisotruxenyl, furanyl, benzofuranyl, isobenzofuranyl, dibenzofuranyl, thiophenyl, benzothiophenyl, isobenzothiophenyl, dibenzothiophenyl, pyrrolyl, indolyl, isoindolyl, carbazolyl, pyridinyl, quinolinyl, isoquinolinyl, acridinyl, phenanthridinyl, benzo-5,6-quinolinyl, benzo-6,7-quinolinyl, benzo-7,8-quinolinyl, phenothiazinyl, phenoxazinyl, pyrazolyl, indazolyl, imidazolyl, benzimidazolyl, naphthimidazolyl, phenanthrimidazolyl, pyridimidazolyl, pyrazinimidazolyl, quinoxalinimidazolyl, oxazolyl, benzoxazolyl, naphthoxazolyl, anthroxazolyl, phenanthroxazolyl, isoxazolyl, 1,2-thiazolyl, 1,3-thiazolyl, benzothiazolyl, pyridazinyl, benzopyridazinyl, pyrimidinyl, benzopyrimidinyl, quinoxalinyl, 1,5-diazaanthracenyl, 2,7-diazapyrenyl, 2,3-diazapyrenyl, 1,6-diazapyrenyl, 1,8-diazapyrenyl, 4,5-diazapyrenyl, 4,5,9,10-tetraazaperylenyl, pyrazinyl, phenazinyl, phenoxazinyl, phenothiazinyl, fluorubinyl, naphthyridinyl, azacarbazolyl, benzocarbolinyl, phenanthrolinyl, 1,2,3-triazolyl, 1,2,4-triazolyl, benzotriazolyl, 1,2,3-oxadiazolyl, 1,2,4-oxadiazolyl, 1,2,5-oxadiazolyl, 1,3,4-oxadiazolyl, 1,2,3-thiadiazolyl, 1,2,4-thiadiazolyl, 1,2,5-thiadiazolyl, 1,3,4-thiadiazolyl, 1,3,5-triazinyl, 1,2,4-triazinyl, 1,2,3-triazinyl, tetrazolyl, 1,2,4,5-tetrazinyl, 1,2,3,4-tetrazinyl, 1,2,3,5-tetrazinyl, purinyl, pteridinyl, indolizinyl, benzothiadiazolyl, benzanthrenyl, benzanthracenyl, rubicenyl and triphenylenyl.

For the purposes of the present invention, $Ar^1$ is preferably substituted by one or more linear, branched or cyclic alkyl or alkoxy radicals. Particular preference is given to linear $C_{1-20}$-alkyl or -alkoxy radicals or tert-butyl radicals.

Examples of polymers according to the invention are those which comprise the structural units depicted below:

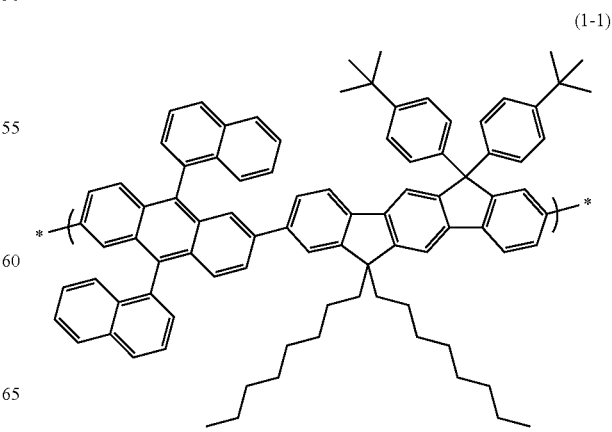
(1-1)

(1-2)
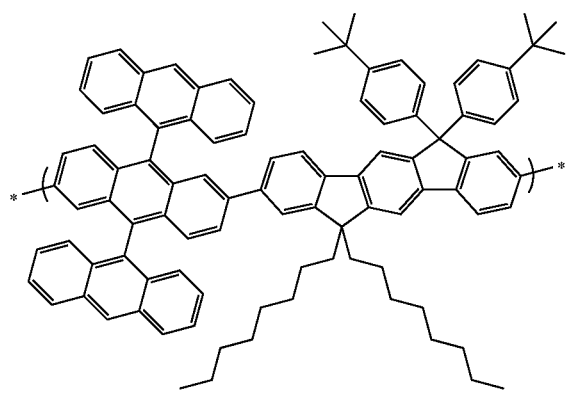
(1-3)
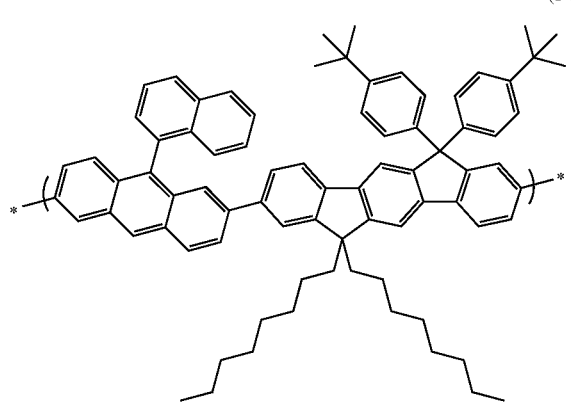
(1-4)
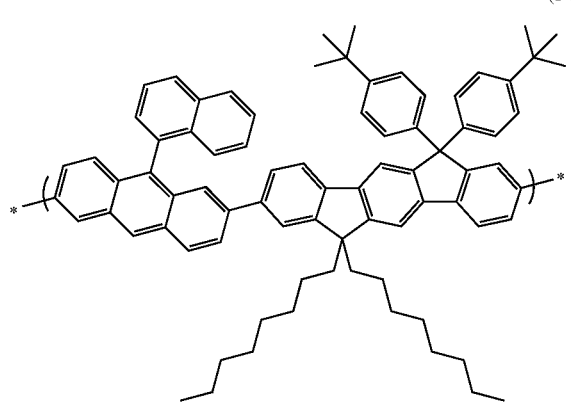
(1-5)
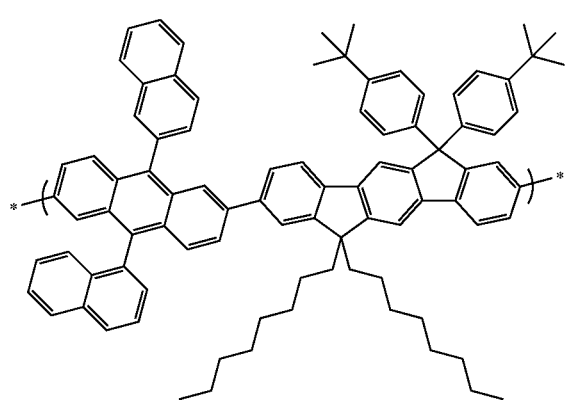
(1-6)
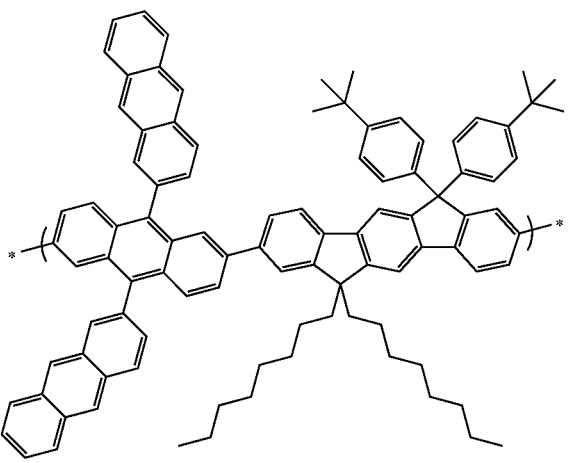
(1-7)
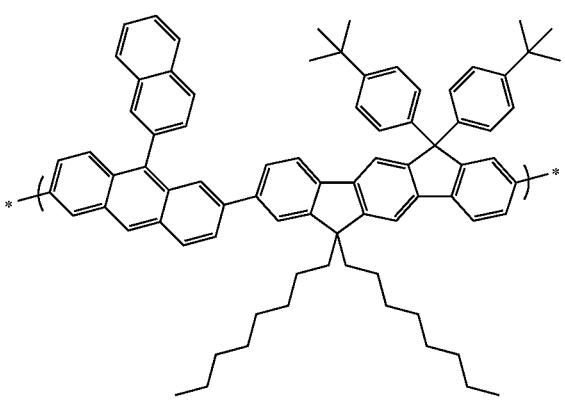
(1-8)
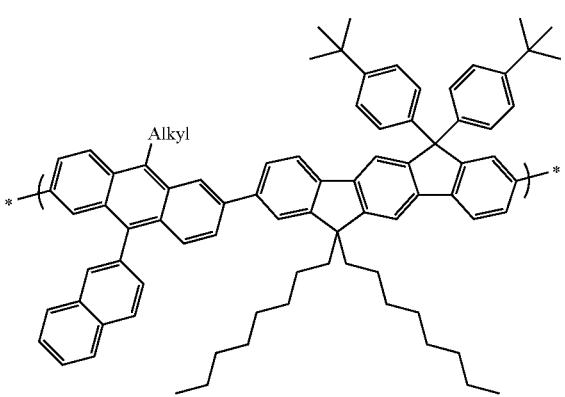

-continued
(1-9)
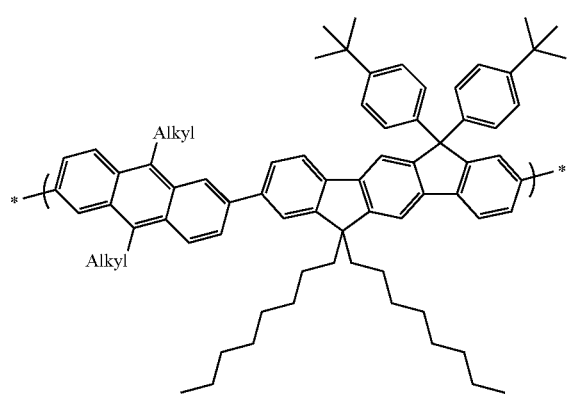
(1-10)
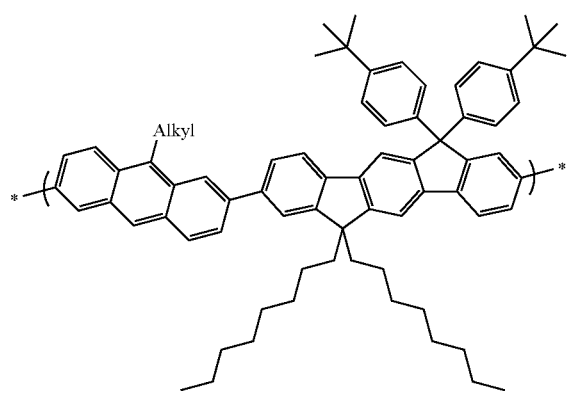
(1-11)
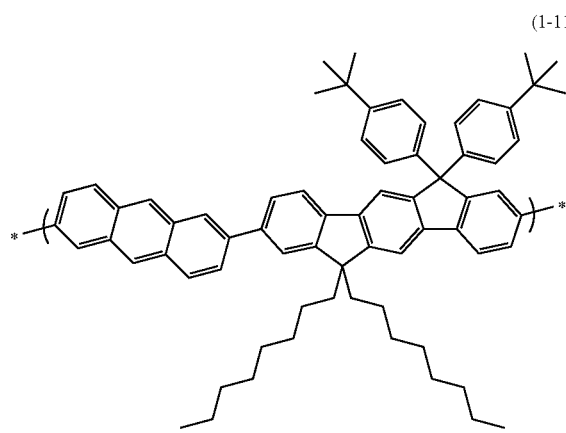
(1-12)
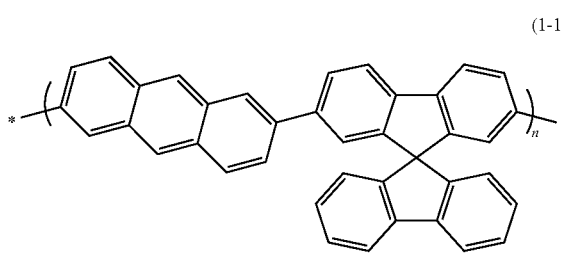
-continued
(1-13)
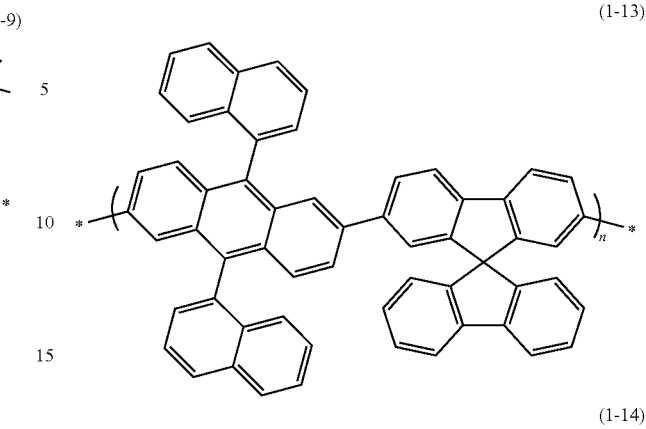
(1-14)
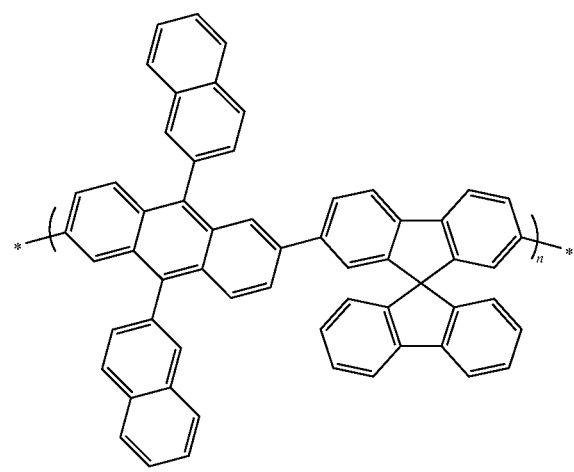
(1-15)
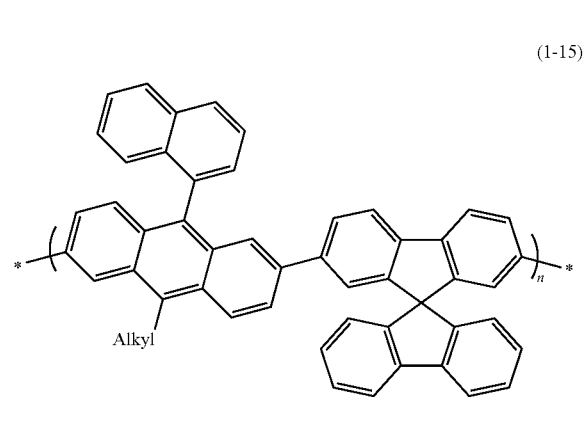
(1-16)
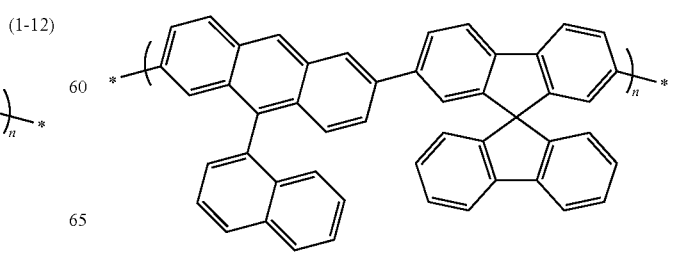

(1-17)

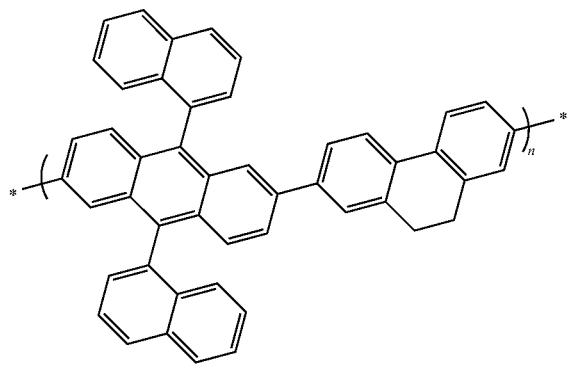

(1-18)

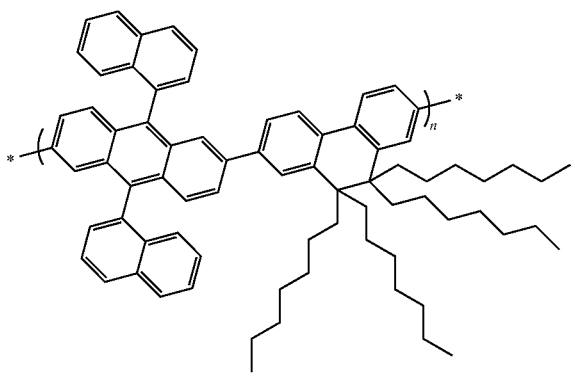

(1-19)

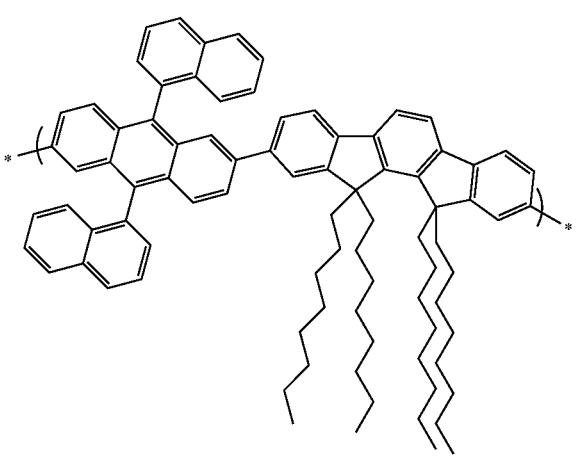

(1-20)

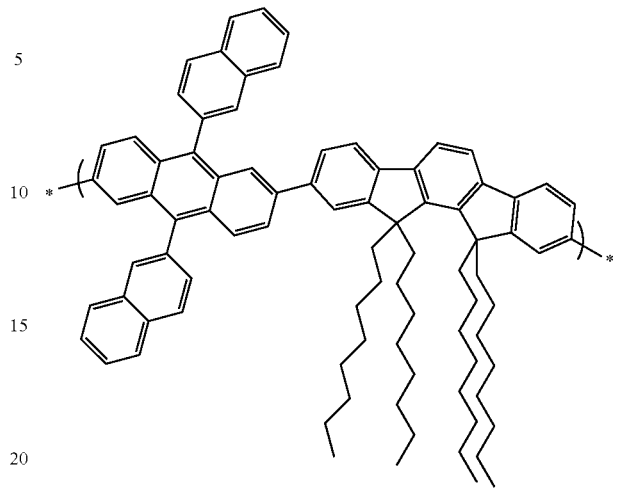

Preference is furthermore given to a polymer which comprises at least one further structural unit which is different from the structural unit of the formula (I). The further structural unit here is preferably selected from a hole-injection, hole-transport, hole-blocking, electron-injection, electron-transport, electron-blocking, emitter, exciton-generating unit, a backbone unit or combinations thereof.

A polymer in the sense of the present invention is also intended to be taken to mean an oligomer and a dendrimer.

For the purposes of the present invention, the term oligomer is applied to a compound which has three to nine recurring units. A polymer in the sense of the present invention is taken to mean a compound which has ten or more recurring units. The branching factor of the polymers here is between 0 (linear polymer, no branching points) and 1 (fully branched dendrimer).

The oligomers, polymers or dendrimers may be conjugated, partially conjugated or non-conjugated, preference being given to conjugated oligomers, polymers or dendrimers. The oligomers or polymers may be linear, branched or dendritic. In the structures linked in a linear manner, the structural units of the formula (I) can either be linked directly to one another or they can be linked to one another via a divalent group, for example via a substituted or unsubstituted alkylene group, via a heteroatom or via a divalent aromatic or heteroaromatic group. In branched structures, for example, three or more structural units of the formula (I) can be linked via a trivalent or polyvalent group, for example via a trivalent or polyvalent aromatic or heteroaromatic group, to form a branched oligomer or polymer.

The proportion of the structural unit of the formula (I) in the polymer can be in the range from 0.05 to 100 mol %, preferably in the range from 0.2 to 80 mol % and particularly preferably in the range from 0.5 to 60 mol %.

The molecular weight $M_w$ of the polymer according to the invention is preferably in the range from 10,000 to 2,000,000 g/mol, particularly preferably in the range from 100,000 to 1,500,000 g/mol, and in particular in the range from 200,000 to 1,000,000 g/mol. The molecular weight $M_w$ is determined via GPC (=gel permeation chromatography) against an internal polystyrene standard.

Besides one or more structural units of the formula (I), the polymers according to the invention may also comprise further structural units which are different from the above-mentioned structural units of the formula (I). These are, inter alia, those as disclosed and listed extensively in WO 02/077060 A1 and in WO 2005/014689 A2. These are incorporated into the present invention by way of reference. The further structural units can originate, for example, from the following classes:
Group 1: units which influence the hole-injection and/or hole-transport properties of the polymers;
Group 2: units which influence the electron-injection and/or electron-trans-port properties of the polymers;
Group 3: units which have combinations of individual units from group 1 and group 2;
Group 4: units which modify the emission characteristics to such an extent that electrophosphorescence can be obtained instead of electrofluorescence;
Group 5: units which improve transfer from the so-called singlet state to the triplet state;
Group 6: units which influence the emission colour of the resultant polymers;
Group 7: units which are typically used as backbone;
Group 8: units which influence the film-morphological and/or rheological properties of the resultant polymers.

Preferred polymers according to the invention are those in which at least one structural unit has charge-transport properties, i.e. which comprise units from group 1 and/or 2.

Structural units from group 1 which have hole-injection and/or hole-trans-port properties are, for example, triarylamine, benzidine, tetraaryl-paraphenylenediamine, triarylphosphine, phenothiazine, phenoxazine, dihydrophenazine, thianthrene, dibenzo-para-dioxin, phenoxathiyne, carbazole, azulene, thiophene, pyrrole and furan derivatives and further O-, S- or N-containing heterocycles having a high HOMO (HOMO=highest occupied molecular orbital). These arylamines and heterocycles preferably result in an HOMO in the polymer of greater than −5.8 eV (against vacuum level), particularly preferably greater than −5.5 eV.

Structural units from group 2 which have electron-injection and/or electron-transport properties are, for example, pyridine, pyrimidine, pyridazine, pyrazine, oxadiazole, quinoline, quinoxaline, anthracene, benzanthracene, pyrene, perylene, benzimidazole, triazine, ketone, phosphine oxide and phenazine derivatives, but also triarylboranes and further O-, S- or N-containing heterocycles having a low LUMO (LUMO=lowest unoccupied molecular orbital). These units in the polymer preferably result in an LUMO of less than −1.5 eV (against vacuum level), particularly preferably less than −2.0 eV.

It may be preferred for the polymers according to the invention to comprise units from group 3 in which structures which increase the hole mobility and structures which increase the electron mobility (i.e. units from groups 1 and 2) are bonded directly to one another or structures which increase both the hole mobility and the electron mobility. Some of these units can serve as emitters and shift the emission colour into the green, yellow or red. Their use is thus suitable, for example, for the generation of other emission colours from originally blue-emitting polymers.

Structural units from group 4 are those which are able to emit light from the triplet state with high efficiency, even at room temperature, i.e. exhibit electrophosphorescence instead of electrofluorescence, which frequently causes an increase in the energy efficiency. Suitable for this purpose are firstly compounds which contain heavy atoms having an atomic number of greater than 36. Preference is given to compounds which contain d- or f-transition metals which satisfy the above-mentioned condition. Particular preference is given here to corresponding structural units which contain elements from groups 8 to 10 (Ru, Os, Rh, Ir, Pd, Pt). Suitable structural units for the polymers according to the invention here are, for example, various complexes, as described, for example, in WO 02/068435 A1, WO 02/081488 A1, EP 1239526 A2 and WO 2004/026886 A2. Corresponding monomers are described in WO 02/068435 A1 and in WO 2005/042548 A1.

Structural units from group 5 are those which improve transfer from the singlet state to the triplet state and which, employed in support of the structural elements from group 4, improve the phosphorescence properties of these structural elements. Suitable for this purpose are, in particular, carbazole and bridged carbazole dimer units, as described, for example, in WO 2004/070772 A2 and WO 2004/113468 A1. Also suitable for this purpose are ketones, phosphine oxides, sulfoxides, sulfones, silane derivatives and similar compounds, as described, for example, in WO 2005/040302 A1.

Structural units from group 6, besides those mentioned above, are those which have at least one further aromatic structure or another conjugated structure which does not fall under the above-mentioned groups, i.e. which have only little influence on the charge-carrier mobilities, are not organometallic complexes or do not influence singlet-triplet transfer. Structural elements of this type can influence the emission colour of the resultant polymers. Depending on the unit, they can therefore also be employed as emitters. Preference is given here to aromatic structures having 6 to 40 C atoms and also tolan, stilbene or bisstyrylarylene derivatives, each of which may be substituted by one or more radicals R. Particular preference is given here to the incorporation of 1,4-phenylene, 1,4-naphthylene, 1,4- or 9,10-anthrylene, 1,6-, 2,7- or 4,9-pyrenylene, 3,9- or 3,10-perylenylene, 4,4'-biphenylene, 4,4''-terphenylylene, 4,4'-bi-1,1'-naphthylylene, 4,4'-tolanylene, 4,4'-stilbenzylene, 4,4''-bisstyrylarylene, benzothiadiazole and corresponding oxygen derivatives, quinoxaline, phenothiazine, phenoxazine, dihydrophenazine, bis(thiophenyl)arylene, oligo(thiophenylene), phenazine, rubrene, pentacene or perylene derivatives, which are preferably substituted, or preferably conjugated push-pull systems (systems which are substituted by donor and acceptor substituents) or systems such as squarines or quinacridones, which are preferably substituted.

Structural units from group 7 are units which contain aromatic structures having 6 to 40 C atoms, which are typically used as polymer backbone. These are, for example, 4,5-dihydropyrene derivatives, 4,5,9,10-tetrahydropyrene derivatives, fluorene derivatives, 9,9'-spirobifluorene derivatives, phenanthrene derivatives, 9,10-dihydrophenanthrene derivatives, 5,7-dihydrodibenzoxepine derivatives and cis- and trans-indenofluorene derivatives.

Structural units from group 8 are those which influence the film-morphological and/or rheological properties of the polymers, such as, for example, siloxanes, long alkyl chains or fluorinated groups, but also particularly rigid or flexible units, such as, for example, liquid crystal-forming units or crosslinkable groups.

Preference is given to polymers according to the invention which, besides structural units of the formula (I), at the same time additionally comprise one or more units selected from groups 1 to 8 which are different from the structural units according to the invention. It may likewise be preferred for more than one structural unit from one group to be present at the same time.

Preference is given here to polymers according to the invention which, besides at least one structural unit of the formula (I), also comprise units from group 7, particularly preferably at least 50 mol % of these units, based on the total number of structural units in the polymer.

It is likewise preferred for the polymers according to the invention to comprise units which improve the charge transport and/or charge injection, i.e. units from group 1 and/or 2; a proportion of 0.5 to 30 mol % of these units is particularly preferred; a proportion of 1 to 10 mol % of these units is very particularly preferred.

It is furthermore particularly preferred for the polymers according to the invention to comprise structural units from group 7 and units from groups 1 and/or 2, in particular at least 50 mol % of units from group 7 and 0.5 to 30 mol % of units from group 1 and/or 2.

The polymers according to the invention are either homopolymers comprising structural units of the formula (I) or copolymers. The polymers according to the invention may be linear, branched or crosslinked. Besides one or more structural units of the formula (I) and preferred sub-formulae thereof, copolymers according to the invention may potentially have one or more further structures from groups 1 to 8 given above.

For the synthesis of the polymers according to the invention, the corresponding monomers are required. Monomers which result in structural units of the formula (I) in the polymers according to the invention are compounds which are correspondingly substituted and have in two positions suitable functionalities which allow this monomer unit to be incorporated into the polymer. These monomers are novel and are therefore likewise a subject-matter of the present invention.

Accordingly, the present invention also relates to compounds of the following formula (III):

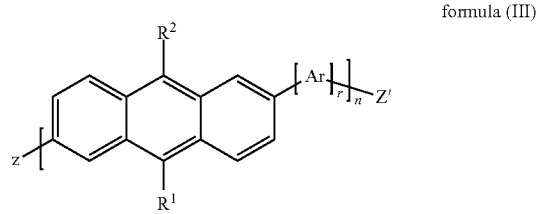

formula (III)

where the symbols used have the following meanings:
Z and Z' are selected, independently of one another, from the group consisting of halogen, O-tosylate, O-triflate, O—SO$_2$R$^8$, B(OR$^8$)$_2$ and Sn(R$^8$)$_3$, where R$^8$ is selected on each occurrence, independently of one another, from the group consisting of H, an aliphatic hydrocarbon radical having 1 to 20 C atoms and an aromatic hydrocarbon radical having 5 to 20 ring atoms, and where two or more radicals R$^3$ may also form an aliphatic ring system with one another,
n is ≥1 and r is 0 or 1, and
where the other symbols have the same meaning as in the above embodiments. The preferred embodiments of the structural unit of the formula (I) are also preferred embodiments here.

In the present invention, halogen is taken to mean fluorine, chlorine, bromine or iodine, where chlorine, bromine and iodine are preferred, and bromine and iodine are particularly preferred.

In a further embodiment of the present invention, Z and Z' in the compounds of the formula (III) are selected, independently of one another, from Br, I and B(OR$^8$)$_2$.

In the present invention, the term "aliphatic hydrocarbon radical having 1 to 20 carbon atoms" is taken to mean a saturated or unsaturated, non-aromatic hydrocarbon radical, which may be linear, branched or cyclic. One or more carbon atoms may have been replaced by O, N or S. In addition, one or more hydrogen atoms may have been replaced by fluorine. Examples of such compounds include the following: methyl, ethyl, n-propyl, i-propyl, n-butyl, i-butyl, s-butyl, t-butyl, 2-methylbutyl, n-pentyl, s-pentyl, cyclopentyl, n-hexyl, cyclohexyl, n-heptyl, cycloheptyl, n-octyl, cyclooctyl, 2-ethylhexyl, trifluoromethyl, pentafluoroethyl, 2,2,2-trifluoroethyl, ethenyl, propenyl, butenyl, pentenyl, cyclopentenyl, hexenyl, cyclohexenyl, heptenyl, cycloheptenyl, octenyl, cyclooctenyl, ethynyl, propynyl, butynyl, pentynyl, hexynyl and octynyl, where methyl, ethyl, i-propyl and i-butyl are particularly preferred.

In the present invention, the term "aromatic hydrocarbon radical having 5 to 20 ring atoms" is taken to mean an aromatic ring system having 6 to 20 carbon atoms or a heteroaromatic ring system having 5 to 20 ring atoms, where one or more of the ring atoms are intended to be a heteroatom selected from N, O and S and the others are carbon atoms. For the purposes of the present invention, these definitions are also intended to be taken to mean a system which does not necessarily contain only aromatic or heteroaromatic groups, but instead in which, in addition, a plurality of aromatic or heteroaromatic groups may be interrupted by a short non-aromatic unit (<10% of the atoms other than H, preferably <5% of the atoms other than H), such as, for example, C(sp$^3$-hybridised), N, O, Si, P, S, Ge (e.g.: CR$_2$, C=O, NR, O, SiR$_2$, P=O, S and GeR$_2$, where R is selected from the group consisting of H, a C$_{1-40}$-alkyl group, a C$_{2-40}$-alkenyl group, a C$_{2-40}$-alkynyl group, an optionally substituted C$_{6-40}$-aryl group and an optionally substituted 5- to 25-membered heteroaryl group). In addition, they may also be monocyclic or polycyclic, i.e. they may have one ring (for example phenyl) or two or more rings, which may also be condensed (for example naphthyl) or covalently linked (for example biphenyl), or contain a combination of condensed and linked rings. Fully conjugated aryl groups are preferred.

The polymers according to the invention are generally prepared by polymerisation of one or more types of monomer, of which at least one type of monomer results in structural units of the formula (I) in the polymer. Suitable polymerisation reactions are known to the person skilled in the art and are described in the literature. Particularly suitable and preferred polymerisation reactions which result in C—C or C—N links are the following:
(A) SUZUKI polymerisation;
(B) YAMAMOTO polymerisation;
(C) STILLE polymerisation;
(D) HECK polymerisation;
(E) NEGISHI polymerisation;
(F) SONOGASHIRA polymerisation;
(G) HIYAMA polymerisation; and
(H) HARTWIG-BUCHWALD polymerisation.

The way in which the polymerisation can be carried out by these methods and the way in which the polymers can then be separated off from the reaction medium and purified is known to the person skilled in the art and is described in detail in the literature, for example in WO 03/048225 A2, WO 2004/037887 A2 and WO 2004/037887 A2.

The methods for the C—C linking reactions are preferably selected from the group comprising SUZUKI coupling, the YAMAMOTO coupling and the STILLE coupling, and the method for a C—N linking reaction is preferably a HARTWIG-BUCHWALD coupling.

The present invention thus also relates to a process for the preparation of the polymers according to the invention, which is characterised in that they are prepared by SUZUKI polymerisation, YAMAMOTO polymerisation, STILLE polymerisation or HARTWIG-BUCHWALD polymerisation.

The present invention furthermore relates to blends comprising a polymer comprising one or more structural units of the general formula (II)

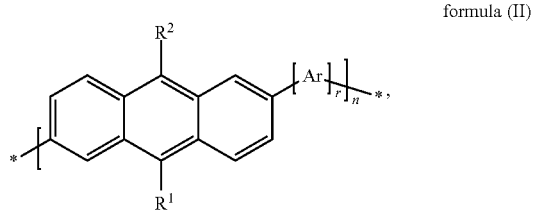

formula (II)

and at least one further, different polymer, oligomer, dendrimer or a low-molecular-weight compound, where the following applies to the symbols and indices used:

Ar is an aryl, aryloxy, heteroaryl or heteroaryloxy group or an aromatic or heteroaromatic ring system, $R^1$ and $R^2$ are each, independently of one another, $Ar^1$, H, D, F, Cl, Br, I, $N(Ar^2)_2$, $C(=O)Ar^2$, $P(=O)Ar^2_2$, $S(=O)Ar^2$, $S(=O)_2Ar^2$, $CR^3=CR^3Ar^2$, CN, $NO_2$, $Si(R^3)_3$, $B(OR^3)_2$, $OSO_2R^3$, a straight-chain alkyl, alkoxy or thioalkoxy group having 1 to 40 C atoms or a branched or cyclic alkyl, alkoxy or thioalkoxy group having 3 to 40 C atoms, each of which may be substituted by one or more radicals $R^3$, one or more non-adjacent $CH_2$ groups may be replaced by $R^3C=CR^3$, $C\equiv C$, $Si(R^3)_2$, $Ge(R^3)_2$, $Sn(R^3)_2$, $C=O$, $C=S$, $C=Se$, $C=NR^3$, $P(=O)(R^3)$, SO, $SO_2$, $NR^3$, O, S or $CONR^3$ and where one or more H atoms may be replaced by F, Cl, Br, I, CN or $NO_2$, $Ar^1$ is selected on each occurrence, in each case independently of one another, from an aryl or heteroaryl group or an aromatic or heteroaromatic ring system, $Ar^2$ is an aryl, aryloxy, heteroaryl or heteroaryloxy group, $R^3$ is in each case, independently of one another, H or an aliphatic or aromatic hydrocarbon radical having 1 to 20 C atoms, n is ≥1 and r is 0 or 1.

Preference is furthermore given to a blend in which, in the polymer according to the invention, $R^1$ and $R^2$ denote a radical $Ar^1$ and r=0.

$Ar^1$ here is on each occurrence, independently of one another, phenyl, naphthyl, anthracenyl, phenanthrenyl, pyrenyl, chrysenyl, perylenyl, fluoranthenyl, naphthacenyl, pentacenyl, benzopyrenyl, biphenyl, biphenylenyl, terphenyl, terphenylenyl, fluorenyl, spirobifluorenyl, dihydrophenanthrenyl, dihydropyrenyl, tetrahydropyrenyl, cis- or trans-indenofluorenyl, truxenyl, isotruxenyl, spirotruxenyl, spiroisotruxenyl, furanyl, benzofuranyl, isobenzofuranyl, dibenzofuranyl, thiophenyl, benzothiophenyl, isobenzothiophenyl, dibenzothiophenyl, pyrrolyl, indolyl, isoindolyl, carbazolyl, pyridinyl, quinolinyl, isoquinolinyl, acridinyl, phenanthridinyl, benzo-5,6-quinolinyl, benzo-6,7-quinolinyl, benzo-7,8-quinolinyl, phenothiazinyl, phenoxazinyl, pyrazolyl, indazolyl, imidazolyl, benzimidazolyl, naphthimidazolyl, phenanthrimidazolyl, pyridimidazolyl, pyrazinimidazolyl, quinoxalinimidazolyl, oxazolyl, benzoxazolyl, naphthoxazolyl, anthroxazolyl, phenanthroxazolyl, isoxazolyl, 1,2-thiazolyl, 1,3-thiazolyl, benzothiazolyl, pyridazinyl, benzopyridazinyl, pyrimidinyl, benzopyrimidinyl, quinoxalinyl, 1,5-diazaanthracenyl, 2,7-diazapyrenyl, 2,3-diazapyrenyl, 1,6-diazapyrenyl, 1,8-diazapyrenyl, 4,5-diazapyrenyl, 4,5,9,10-tetraazaperylenyl, pyrazinyl, phenazinyl, phenoxazinyl, phenothiazinyl, fluorubinyl, naphthyridinyl, azacarbazolyl, benzocarbolinyl, phenanthrolinyl, 1,2,3-triazolyl, 1,2,4-triazolyl, benzotriazolyl, 1,2,3-oxadiazolyl, 1,2,4-oxadiazolyl, 1,2,5-oxadiazolyl, 1,3,4-oxadiazolyl, 1,2,3-thiadiazolyl, 1,2,4-thiadiazolyl, 1,2,5-thiadiazolyl, 1,3,4-thiadiazolyl, 1,3,5-triazinyl, 1,2,4-triazinyl, 1,2,3-triazinyl, tetrazolyl, 1,2,4,5-tetrazinyl, 1,2,3,4-tetrazinyl, 1,2,3,5-tetrazinyl, purinyl, pteridinyl, indolizinyl, benzothiadiazolyl, benzanthrenyl, benzanthracenyl, rubicenyl or triphenylenyl.

Particular preference is given, for example, to a blend in which, in the polymer according to the invention, the structural unit of the formula (II) is the following:

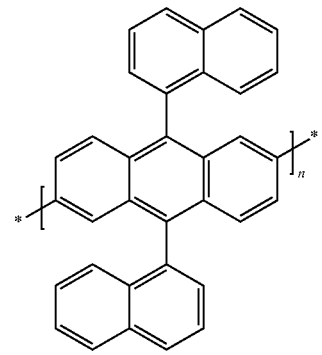

Particular preference is also given to a blend in which the polymer is a polymer which comprises structural units of the formula (I), and preferred embodiments thereof.

In a preferred embodiment of the present invention, the blend comprises a polymer comprising structural units of the formulae (I) and/or (II), as defined above, and a polymeric compound comprising one or more emitter units. In a further preferred embodiment, the blend comprises a polymer comprising structural units of the formulae (I) and/or (II), a polymer comprising one or more emitter units and a third component which introduces an additional functionality. This may in turn be a polymer, but may also be a small molecule.

The blend may additionally also comprise further polymeric compounds. In the extreme case, the requisite functionalities may be distributed over the same number of polymers. In this case, a blend can be built up as follows in accordance with the invention:

polymer comprising structural units according to the invention and
polymer comprising hole-injection units and/or
polymer comprising hole-transport units and/or
polymer comprising hole-blocking units and/or
polymer comprising emitter units and/or
polymer comprising electron-injection units and/or
polymer comprising electron-transport units and/or
polymer comprising electron-blocking units and/or
polymer comprising exciton-generating units.

Preference is thus also given in accordance with the invention to a blend comprising further polymers, each of which comprise, independently of one another, a hole-injection, hole-transport, hole-blocking, electron-injection, electron-transport, electron-blocking, emitter or exciton-generating unit.

The polymer according to the invention or the blend according to the invention can be used in an organic electronic device, in which the polymer or blend is preferably within an organic layer. The organic layer may furthermore comprise further constituents, for example low-molecular-weight compounds or compounds which improve the film-formation properties. For the production of the organic layer, a liquid formulation comprising the polymer or blend according to the invention and one or more solvents is usually used. The polymer layer can be produced, for example, by coating from solution, for example spin coating, ink-jetting or the like. The techniques necessary for this purpose are known to the person skilled in the art. After application of the polymer layer and removal of the solvent, the polymer can additionally be crosslinked. The crosslinking is carried out with radiation induction (for example with UV light, visible light, microwaves, electron beams) or thermally. However, substituents which are suitable for crosslinking, for example vinyl groups, must be present.

The present invention thus also relates to a formulation comprising a polymer or blend according to the invention and one or more solvents. The way in which formulations of this type can be prepared is known to the person skilled in the art and is described, for example, in WO 02/072714, WO 03/019694 and the literature cited therein.

Suitable and preferred solvents are, for example, toluene, anisoles, xylenes, methyl benzoate, dimethyl anisoles, mesitylenes, tetralin, veratrots and tetrahydrofuran or mixtures thereof.

The polymers, blends (mixtures) and formulations according to the invention can be used in electronic or opto-electronic devices or for the production thereof.

The present invention thus furthermore relates to the use of the polymers, blends (mixtures) and formulations according to the invention in electronic or opto-electronic devices, preferably in organic or polymeric organic electroluminescent devices (OLEDs, PLEDs), organic field-effect transistors (OFETs), organic integrated circuits (O-ICs), organic thin-film transistors (TFTs), organic solar cells (O-SCs), organic laser diodes (O-lasers), organic photovoltaic (OPV) elements or devices or organic photoreceptors (OPCs), particularly preferably in organic or polymeric organic electroluminescent devices (OLEDs, PLEDs), in particular in polymeric organic electroluminescent devices (PLEDs).

The way in which OLEDs or PLEDs can be produced is known to the person skilled in the art and is described in detail, for example, as a general process in WO 2004/070772 A2, which should be adapted correspondingly for the individual case.

As described above, the polymers according to the invention are very particularly suitable as electroluminescent materials in PLEDs or displays produced in this way.

Electroluminescent materials in the sense of the present invention are taken to mean materials which can be used as active layer. Active layer means that the layer is capable of emitting light on application of an electric field (light-emitting layer) and/or that it improves the injection and/or transport of positive and/or negative charges (charge-injection or charge-transport layer).

The present invention therefore also preferably relates to the use of the polymers or blends (mixtures) according to the invention in a PLED, in particular as electroluminescent material.

The present invention furthermore relates to an organic electronic device comprising one or more organic layers, where at least one layer comprises a polymer according to the invention or a blend according to the invention.

In a further embodiment of the invention, the device comprises a plurality of layers. These can be layers which comprise the polymer according to the invention or the blend according to the invention or layers which comprise polymers which are independent thereof, blends or low-molecular-weight compounds. The polymer according to the invention or the blend according to the invention can be present here in the form of a hole-transport, hole-injection, emitter, electron-transport, electron-injection, charge-blocking and/or charge-generation layer.

The organic electroluminescent device here may comprise one emitting layer or a plurality of emitting layers, where at lkeast one emitting layer comprises or consists of at least one polymer according to the invention or blend according to the invention. If a plurality of emission layers are present, these preferably have in total a plurality of emission maxima between 380 nm and 750 nm, resulting overall in white emission, i.e. various emitting compounds which are able to fluoresce and/or phosphoresce are used in the emitting layers. Particular preference is given to three-layer systems, where the three layers exhibit blue, green and orange or red emission (for the basic structure see, for example, WO 05/011013). White-emitting devices are suitable, for example, as lighting or backlighting of displays (LCDs).

Apart from these layers, it may also comprise further layers, for example in each case one or more hole-injection layers, hole-transport layers, hole-blocking layers, electron-transport layers, electron-injection layers, exciton-blocking layers and/or charge-generation layers (IDMC 2003, Taiwan; Session 21 OLED (5), T. Matsumoto, T. Nakada, J. Endo, K. Mori, N. Kawamura, A. Yokoi, J. Kido, *Multiphoton Organic EL Device Having Charge Generation Layer*). It is likewise possible for interlayers, which have, for example, an exciton-blocking function, to be introduced between two emitting layers. However, it should be pointed out that each of these layers does not necessarily have to be present. These layers may likewise comprise the polymers or blends according to the invention, as defined above. It is also possible for a plurality of OLEDs to be arranged one above the other, which enables a further increase in efficiency with respect to the light yield to be achieved. In order to improve the coupling-out of light, the final organic layer on the light exit side in OLEDs can also be designed as a nanofoam, which reduces the proportion of total reflection. The device may furthermore comprise layers which are built up from small molecules (SMOLEDs). These can be produced by evaporation of small molecules in a high vacuum.

Preference is thus furthermore given to an organic electroluminescent device in which one or more layers are applied by means of a sublimation process, in which the materials are vapour-deposited in vacuum sublimation units at a pressure of less than $10^{-5}$ mbar, preferably less than $10^{-6}$ mbar, particularly preferably less than $10^{-7}$ mbar.

Preference is likewise given to an organic electroluminescent device which is characterised in that one or more layers are applied by means of the OVPD (organic vapour phase deposition) process or with the aid of carrier-gas sublimation, where the materials are applied at a pressure of between $10^{-5}$ mbar and 1 bar.

Preference is furthermore given to an organic electroluminescent device in which one or more layers are produced from solution, such as, for example, by spin coating, or by means of any desired printing process, such as, for example, screen printing, flexographic printing or offset printing, but particularly preferably LITI (light induced thermal imaging, thermal transfer printing) or ink-jet printing. Soluble compounds, which are obtained, if necessary, by suitable substitution, are necessary for this purpose.

The organic electronic device is preferably an organic electroluminescent device (OLED), a polymeric electroluminescent device (PLED), an organic integrated circuit (O-IC), an organic field-effect transistor (O-FET), an organic thin-film transistor (O-TFT), an organic light-emitting transistor (O-LET), an organic solar cell (O-SC), an organic optical detector, an organic photoreceptor, an organic field-quench device (O-FQD), a light-emitting electrochemical cell (LEC) or an organic laser diode (O-laser).

The device usually comprises a cathode and an anode (electrodes). For the purposes of the present invention, the electrodes (cathode, anode) are selected in such a way that their potential matches as closely as possible the potential of the adjacent organic layer in order to ensure highly efficient electron or hole injection.

The cathode preferably comprises metal complexes, metals having a low work function, metal alloys or multilayered structures comprising various metals, such as, for example, alkaline-earth metals, alkali metals, main-group metals or lanthanoids (for example Ca, Ba, Mg, Al, In, Mg, Yb, Sm, etc.). In the case of multilayered structures, further metals which have a relatively high work function, such as, for example, Ag, can also be used in addition to the said metals, in which case combinations of the metals, such as, for example, Ca/Ag or Ba/Ag, are generally used. It may also be preferred to introduce a thin interlayer of a material having a high dielectric constant between a metallic cathode and the organic semiconductor. Suitable for this purpose are, for example, alkali metal or alkaline-earth metal fluorides, but also the corresponding oxides (for example LiF, $Li_2O$, $BaF_2$, MgO, NaF, etc.). The layer thickness of this layer is preferably between 1 and 10 nm, particularly preferably between 2 and 8 nm.

The anode preferably comprises materials having a high work function. The anode preferably has a potential of greater than 4.5 eV vs. vacuum. Suitable for this purpose are on the one hand metals having a high redox potential, such as, for example, Ag, Pt or Au. On the other hand, metal/metal oxide electrodes (for example $Al/Ni/NiO_x$, $Al/PtO_x$) may also be preferred. For some applications, at least one of the electrodes must be trans-parent in order to facilitate either irradiation of the organic material (O-SCs) or the coupling-out of light (OLEDs/PLEDs, O-lasers). A preferred construction uses a transparent anode. Preferred anode materials here are conductive mixed metal oxides. Particular preference is given to indium tin oxide (ITO) or indium zinc oxide (IZO). Preference is furthermore given to conductive doped organic materials, in particular conductive doped polymers, such as, for example, PEDOT or PANI.

The device is correspondingly structured in a manner known per se, depending on the application, provided with contacts and finally hermetically sealed, since the lifetime of such devices is drastically shortened in the presence of water and/or air.

The invention is explained in greater detail below with reference to some examples, which should not be taken to be restrictive of the scope of the invention.

WORKING EXAMPLES

A) Examples 1 to 3

Preparation of the Monomers

Example 1

Preparation of compound 3
(2,6-dibromo-9,10-dinaphthalen-1-ylanthracene)

Compound 3 is prepared as follows:

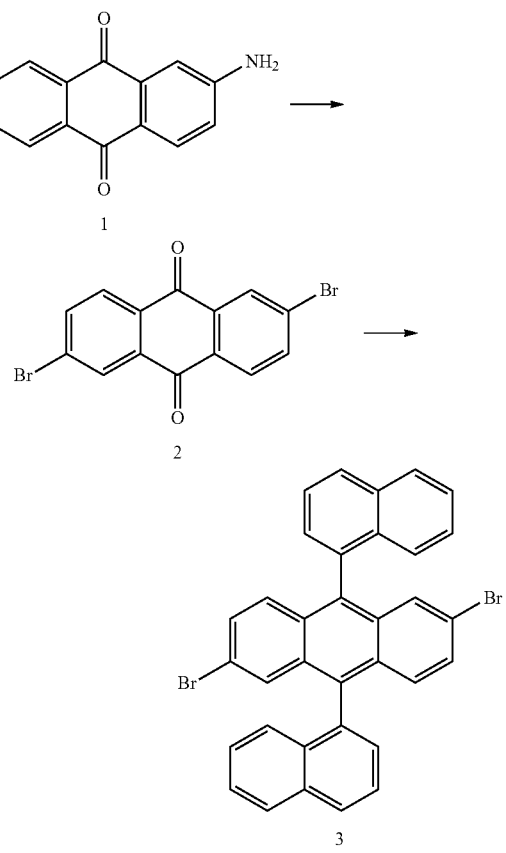

1st Step: Compound 2

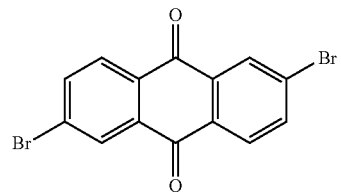

299.57 g (2.16 molar equivalents, 1.328 mol) of copper(II) bromide and 2500 ml of acetonitrile are added to 151.35 g (1 molar equivalent, 0.616 mol) of 2,6-diaminoanthraquinone 1. The batch is heated to 60° C.

164 ml (2.01 molar equivalents, 1.241 mol) of tert-butyl nitrite are added dropwise at this temperature, and the mixture is subsequently stirred for a further 2 hours at 60° C. and overnight at room temperature. The suspension is slowly poured into a mixture of 2.5 l of ice, 300 ml of concentrated HCl and 300 ml of H$_2$O. The solid is filtered off with suction and washed by stirring with hot dimethyl sulfoxide (DMSO) and subsequently with hot ethanol. The resultant solid 2 (178.48 g, 79.1%) is employed in the subsequent reaction without further purification.

$^1$H NMR (CDCl$_2$, δ (ppm), J (Hz)): 7.95 (d, 2H, J=8.25), 8.14 (d, 2H, J=8.25), 8.40 (s, 2H).

2nd Step: Compound 3

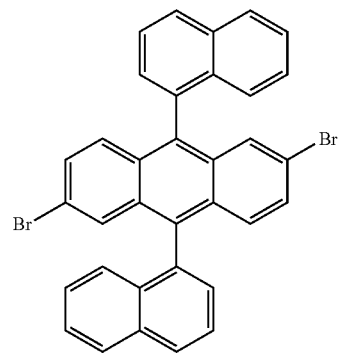

3

50.53 ml (3 molar equivalents, 0.352 mol) of 1-bromonaphthalene are initially introduced in THF and cooled to −78° C. 140.98 ml (3 molar equivalents, 0.352 mol) of n-butyllithium (2.5 M in hexane) are added dropwise, and the mixture is subsequently stirred at −78° C. for 2 hours. 43 g (1 molar equivalent, 0.117 mol) of 2,6-dibromoanthraquinone 2 are then added in small portions. The reaction solution is stirred for a further hour at −70° C. and overnight at room temperature. 90.92 g (4 molar equivalents, 0.470 mol) of SnCl$_2$ are subsequently dissolved in 200 ml of 10% HCl and slowly added dropwise. The reaction mixture is warmed under reflux for 3 hours. When the reaction is complete, the reaction mixture is filtered with suction.

Purification is carried out by recrystallisation from N-methylpyrrolidone (NMP) and gives white crystals (9.1 g, 13.2%).

$^1$H NMR (d$_8$-THF, δ (ppm), J (Hz)): 7.08 (d, 2H, J=8.4), 7.17-7.35 (m, 6H), 7.52 (t, 2H, J=7.9), 7.60 (s, 2H), 7.66 (d, 2H, J=6.9), 7.79 (t, 2H, J=6.9), 8.07 (d, 2H, J=8.3), 8.17 (d, 2H, J=8.3)

Example 2

Preparation of compound 4
(2,6-dibromo-9,10-dinaphthalen-2-ylanthracene)

Compound 4 is prepared as follows:

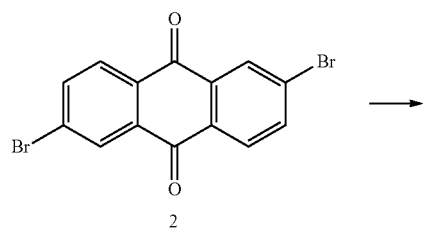

2

1st Step: Compound 4

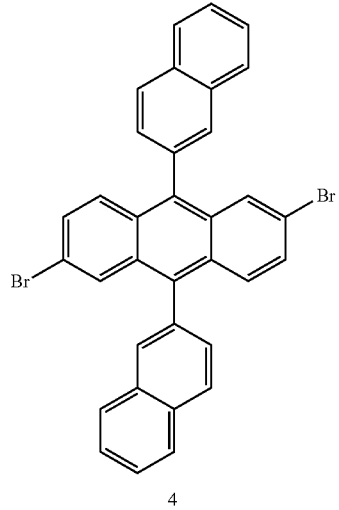 [SMILES: Brc1ccc2c(-c3ccc4ccccc4c3)c3cc(Br)ccc3c(-c3ccc4ccccc4c3)c2c1]

4

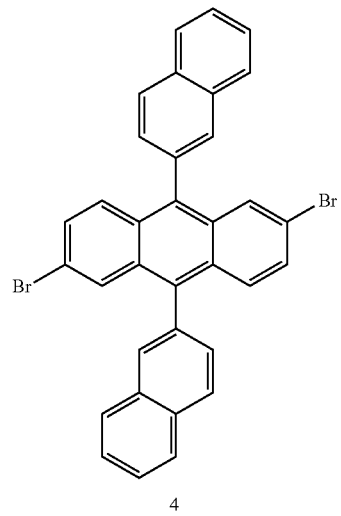

4

25 g (3 molar equivalents, 0.12 mol) of 2-bromonaphthalene are initially introduced in 150 ml of THF and cooled to −78° C. 54 ml (3.3 molar equivalents, 0.13 mol) of n-butyllithium (2.5 M in hexane) are added dropwise, and the mixture is subsequently stirred at −78° C. for 1 hour. 15 g (1 molar equivalent, 0.04 mol) of 2,6-dibromoanthraquinone 2 are then added in small portions. The reaction solution is stirred for a further hour at −70° C. and overnight at room temperature. 31.50 g (4 molar equivalents, 0.163 mol) of SnCl$_2$ are subsequently dissolved in 100 ml of 10% HCl and slowly added dropwise.

The reaction mixture is warmed under reflux for 3 hours. When the reaction is complete, the reaction mixture is filtered with suction.

Purification is carried out by recrystallisation from N-methylpyrrolidone (NMP) and gives a white-yellow solid (1.5 g, 6.25%).

$^1$H NMR (CDCl$_2$, δ (ppm), J (Hz)): 7.36 (br d, 2H, J=9.26), 7.57-7.66 (m, 8H), 7.86 (d, 2H, J=1.69), 7.96 (d, 4H, J=9.93), 8.05 (d, 2H, J=6.9), 8.12 (d, 2H, J=8.25)

Example 3

Preparation of compound 5
(2,6-dibromo-9,10-diphenylanthracene)

Compound 5 is prepared as follows:

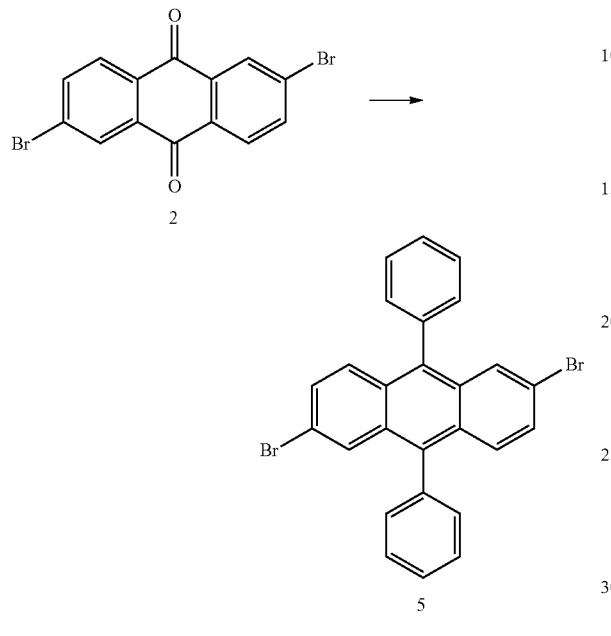

1st Step: Compound 5

47.71 ml (3.3 molar equivalents, 0.45 mol) of 2-bromobenzene are initially introduced in 800 ml of THF and cooled to −78° C. 164 ml (3.0 molar equivalents, 0.41 mol) of n-butyllithium (2.5 M in hexane) are added dropwise, and the mixture is subsequently stirred at −78° C. for 1 hour. 50 g (1 molar equivalent, 1.37 mol) of 2,6-dibromoanthraquinone 2 are then added in small portions. The reaction solution is stirred for a further hour at −70° C. and overnight at room temperature. 105.73 g (4 molar equivalents, 5.46 mol) of $SnCl_2$ are subsequently dissolved in 200 ml of 10% HCl and slowly added dropwise. The reaction mixture is warmed under reflux for 3 hours. When the reaction is complete, the reaction mixture is filtered with suction.

Purification is carried out by recrystallisation from N-methylpyrrolidone (NMP) and gives a white-yellow solid (33.8 g, 50.6%).

$^1$H NMR (CDCl$_3$, δ (ppm), J (Hz)): 7.37 (dd, 2H, J$_1$=9.3; J$_2$=2.0), 7.42-7.44 (m, 4H), 7.86 (d, 2H, J=9.3), 7.58-7.63 (m, 6H), 7.81 (d, 2H, J=2.0)

B) Examples 4 to 13

Preparation of the Polymers

Polymers P1 to P6 according to the invention and comparative polymers C1 to C4 are synthesised by SUZUKI coupling in accordance with WO 03/048225 A2 using the following monomers (percent data=mol %).

Example 4

Polymer P1

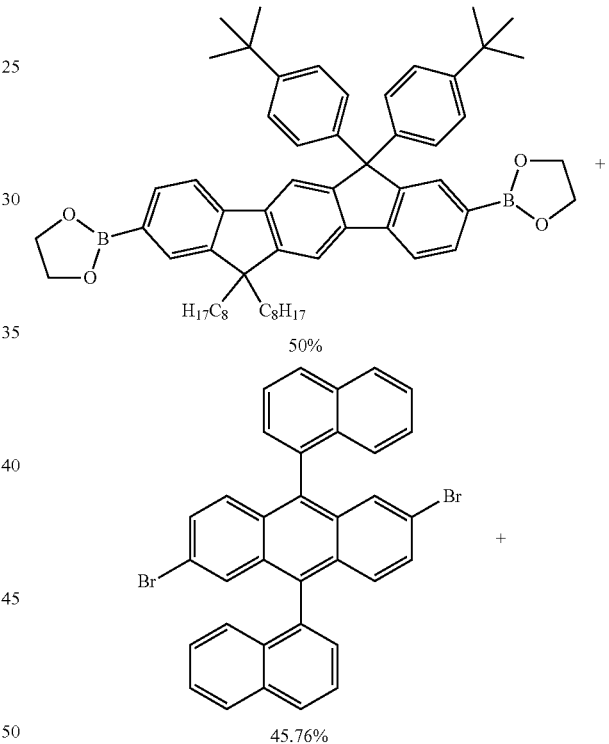

50%

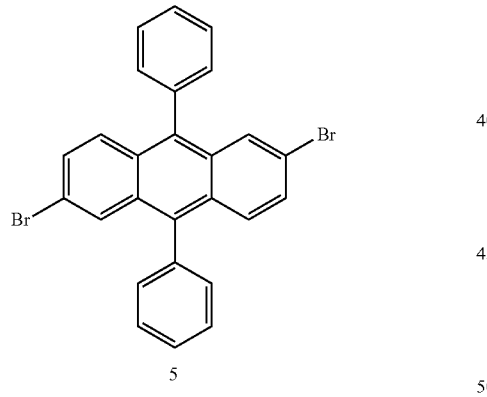

45.76%

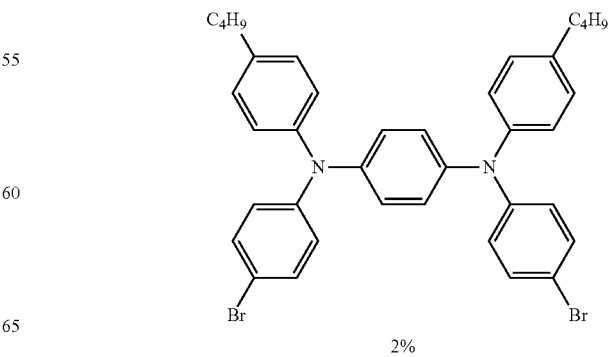

2%

Example 5
Polymer P2
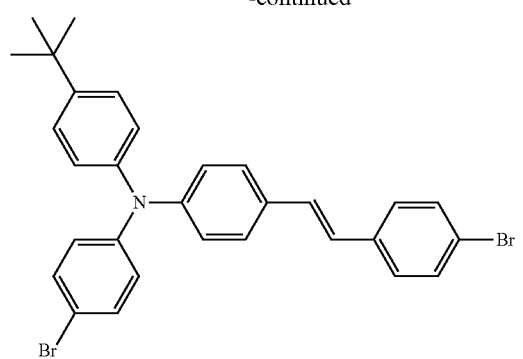
2%
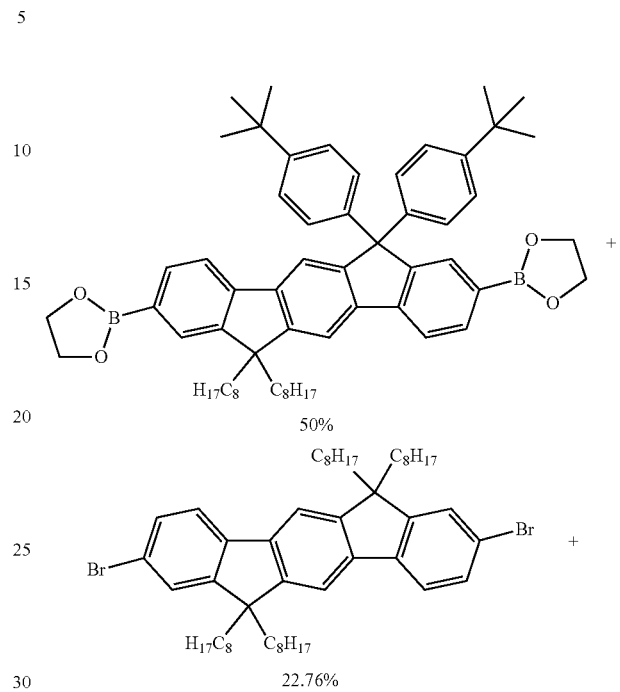
50%
22.76%
21%
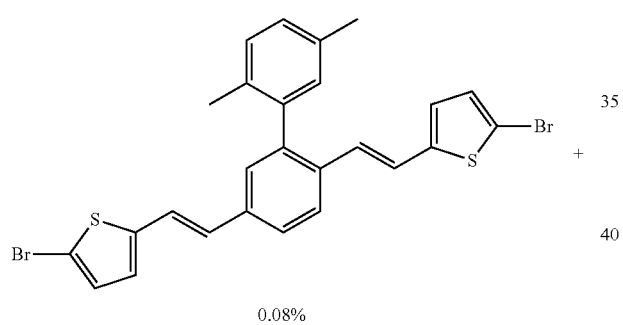
0.08%
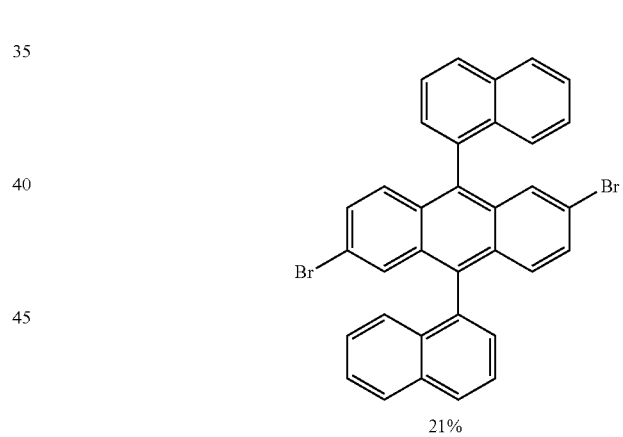
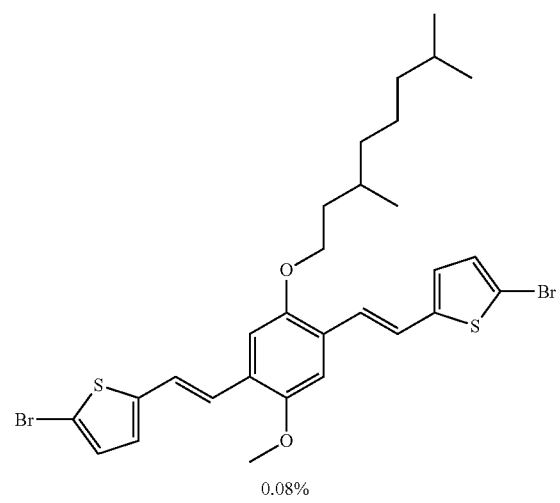
0.08%
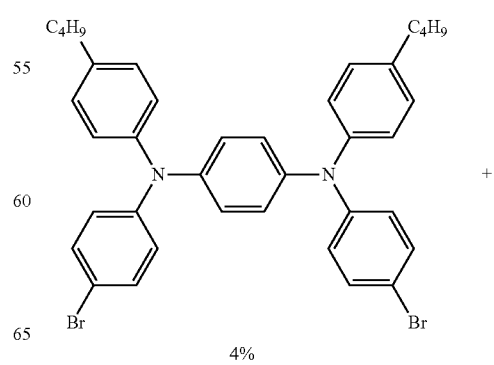
0.08%
4%

Comparative Example 6
Comparative Polymers C1a and C1b
C1a:
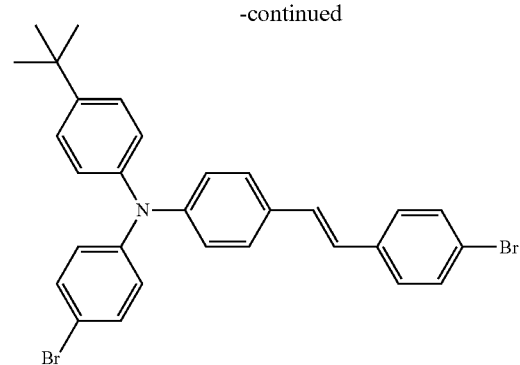
2%
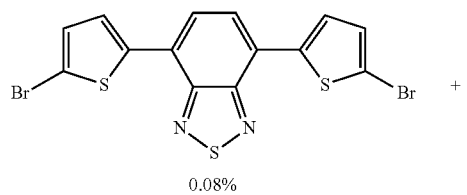
0.08%
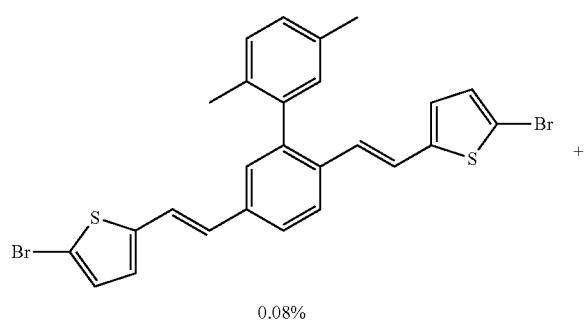
0.08%
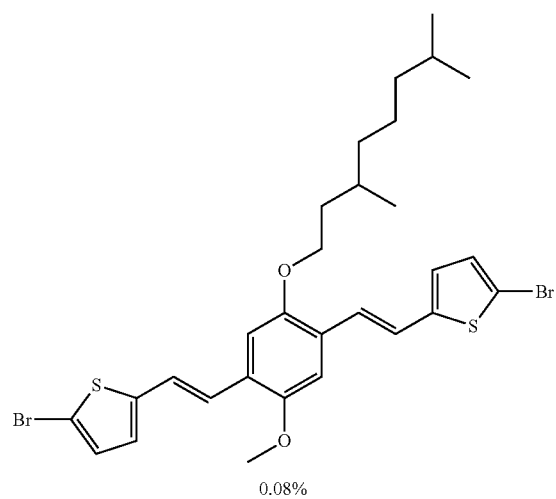
0.08%
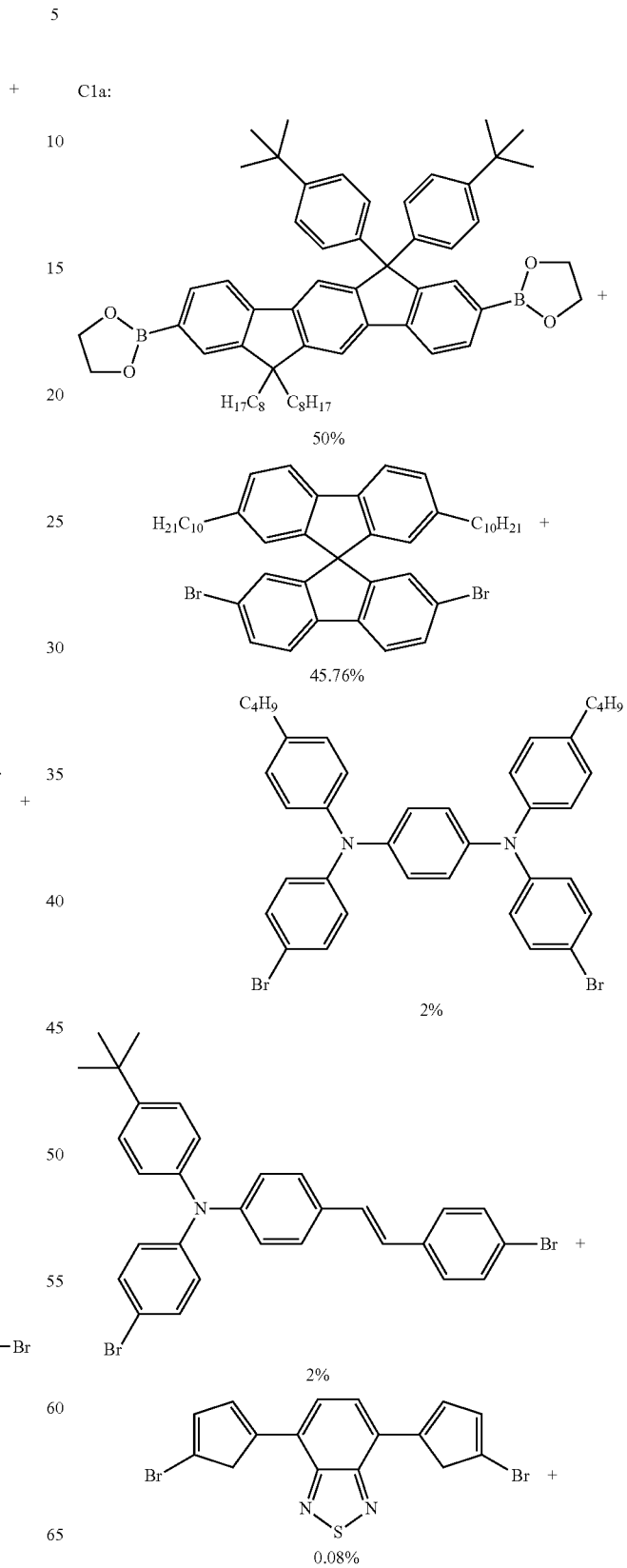

33
-continued
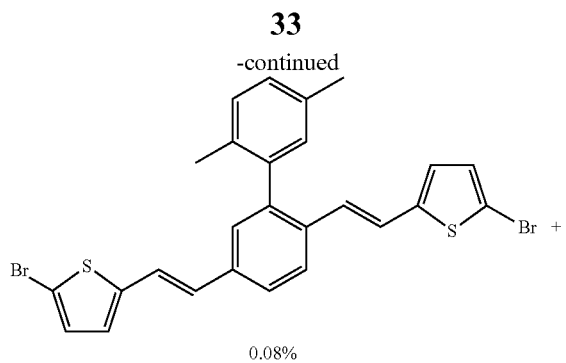
0.08%
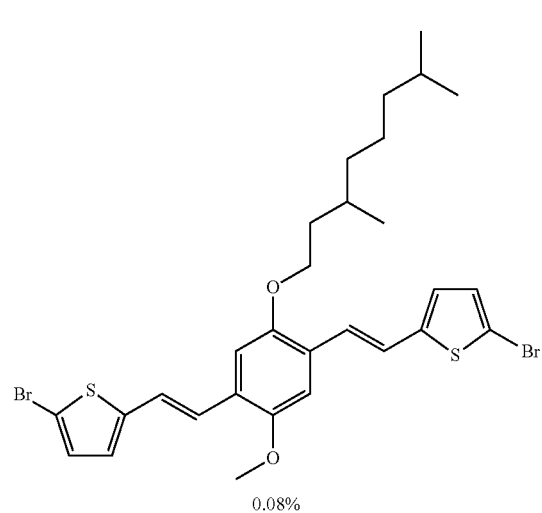
0.08%
C1b:
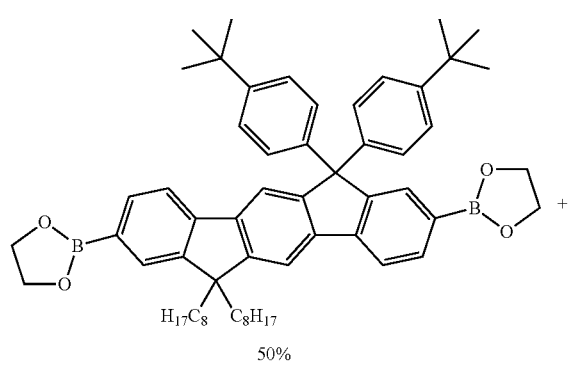
50%
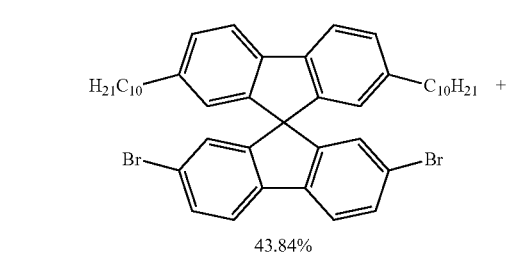
43.84%
34
-continued
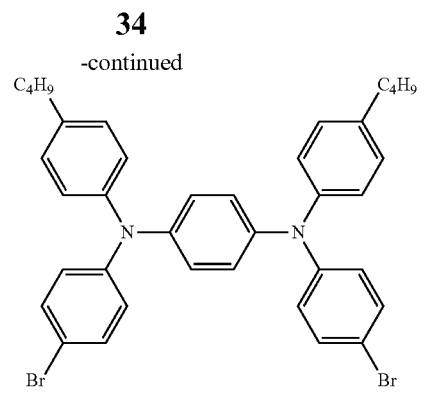
2%
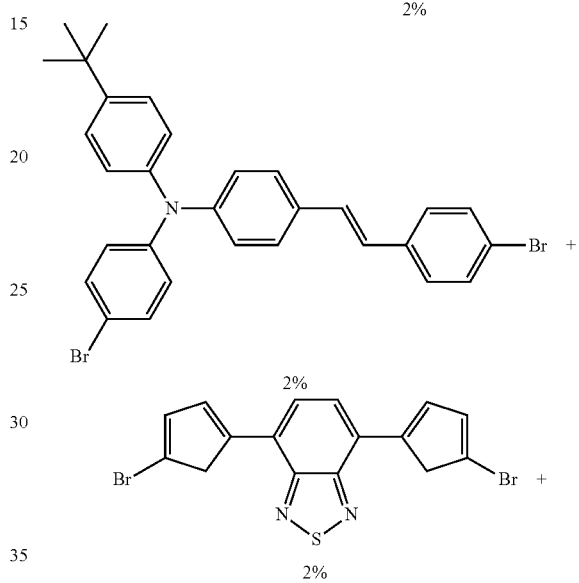
2%
2%
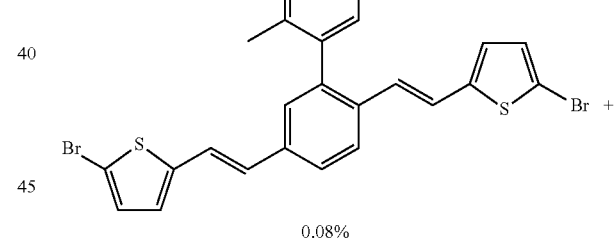
0.08%
0.08%

Example 7
Polymer P3
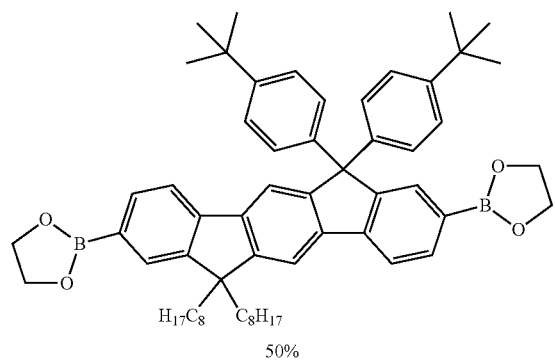
50%
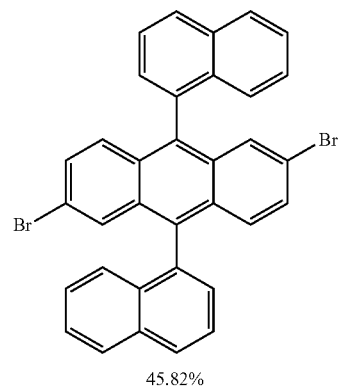
45.82%
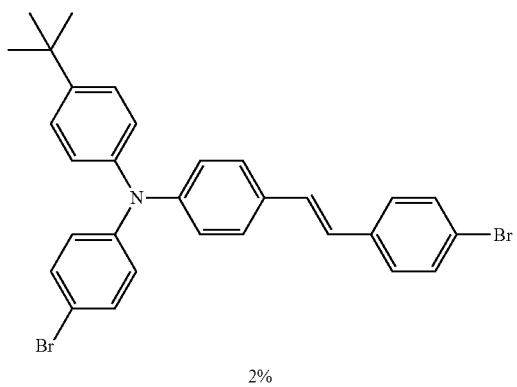
2%
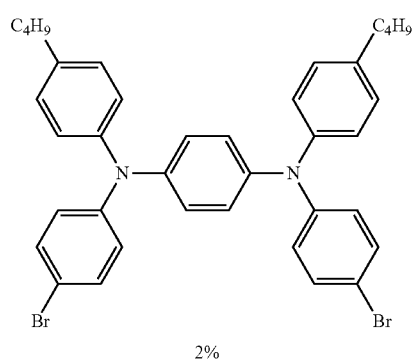
2%
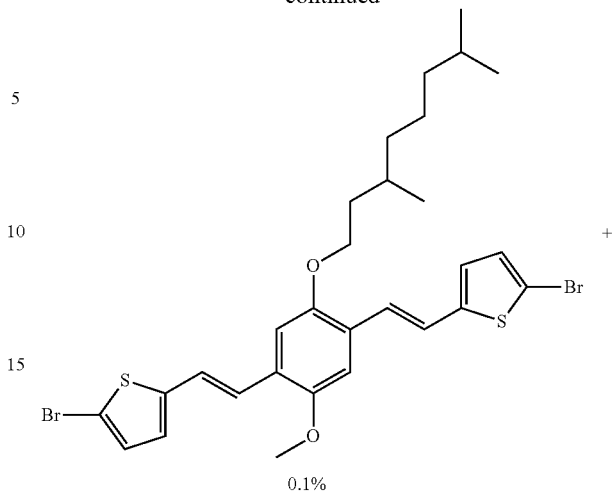
0.1%
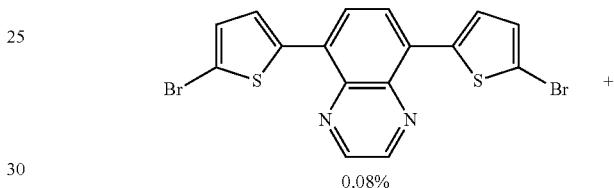
0.08%
Comparative Example 8
Comparative Polymer C2
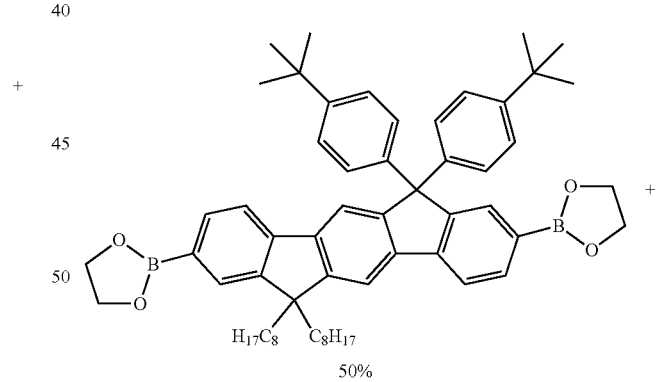
50%
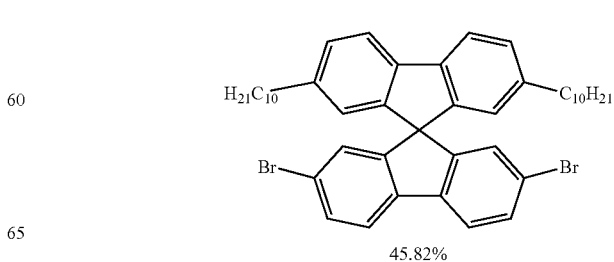
45.82%

-continued
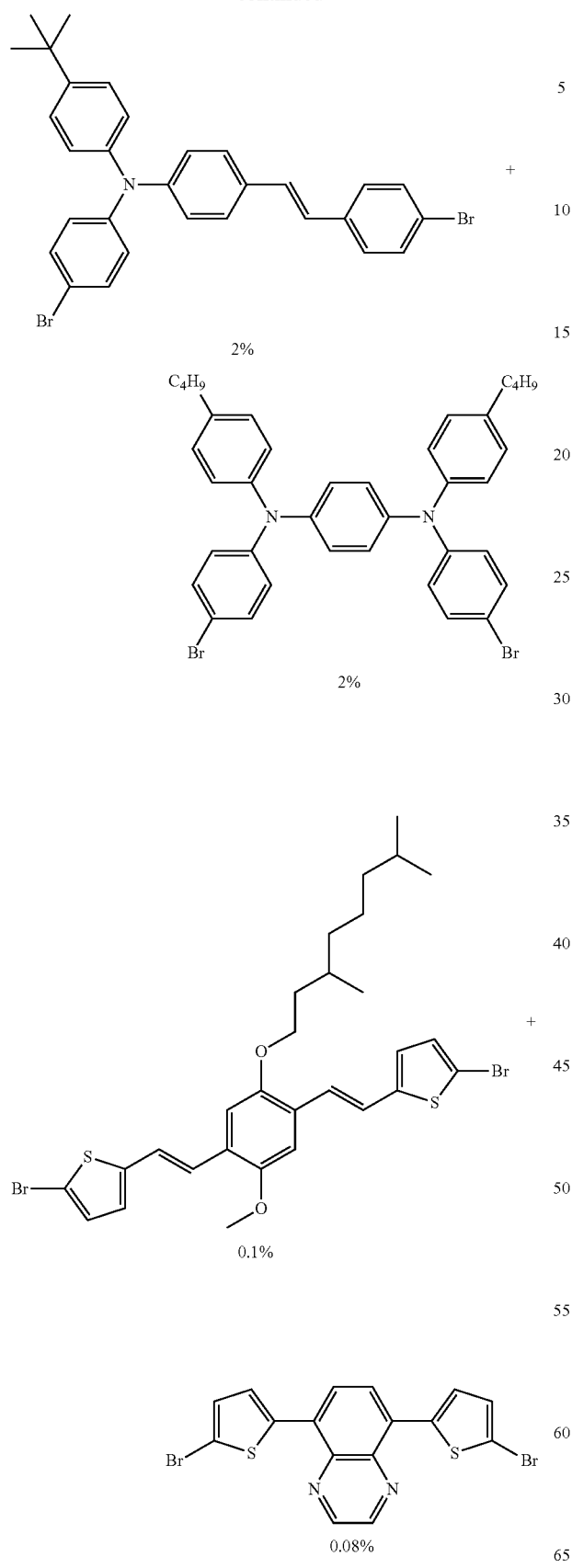
2%
2%
0.1%
0.08%
Example 9
Polymer P4
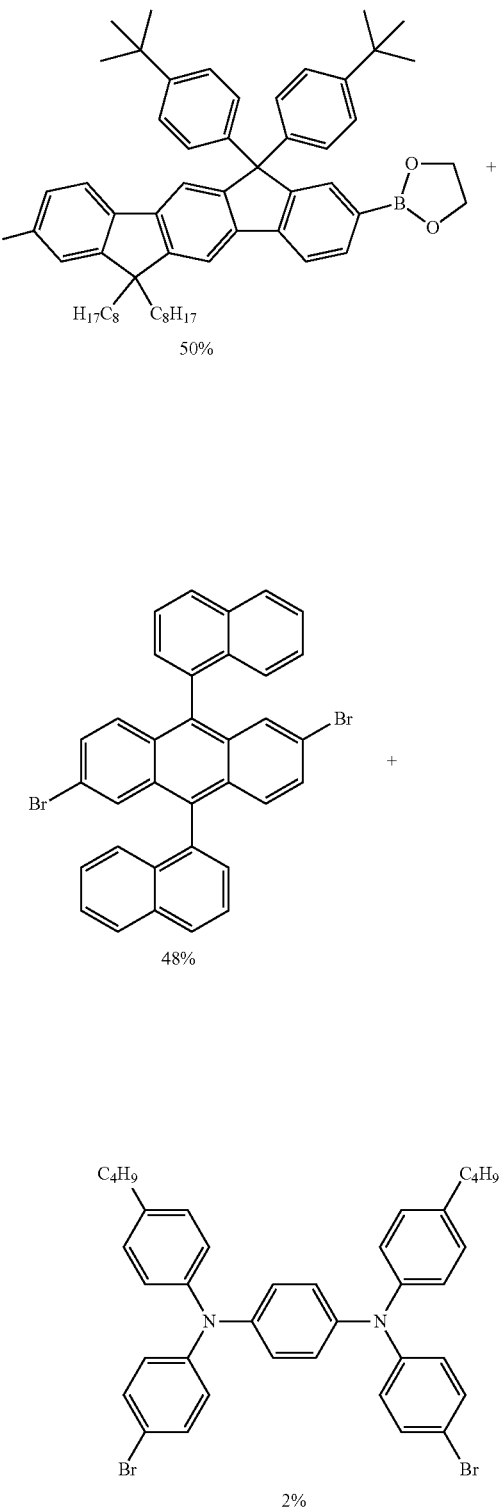
50%
48%
2%

Example 10
Polymer P5
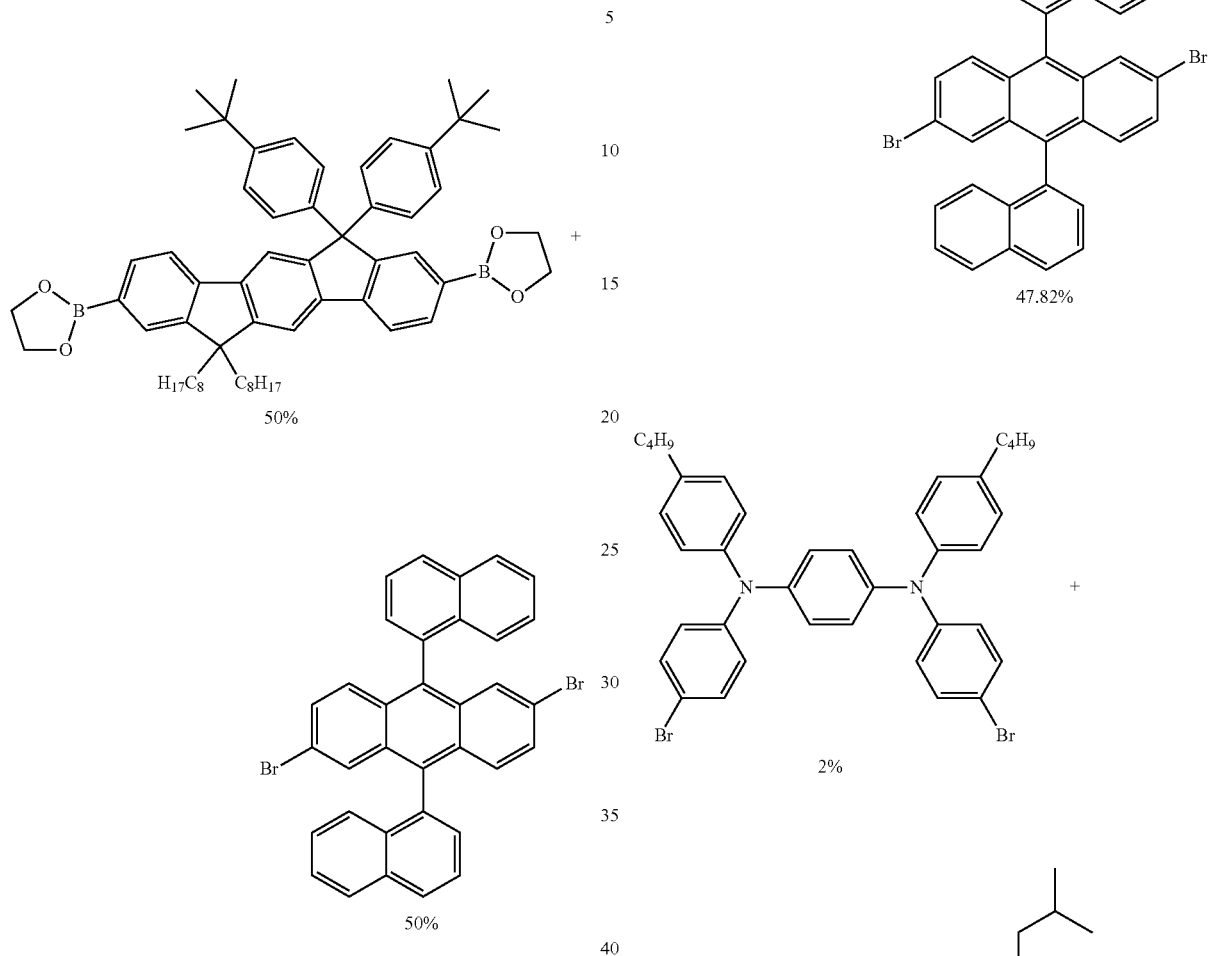
Example 11
Polymer P6
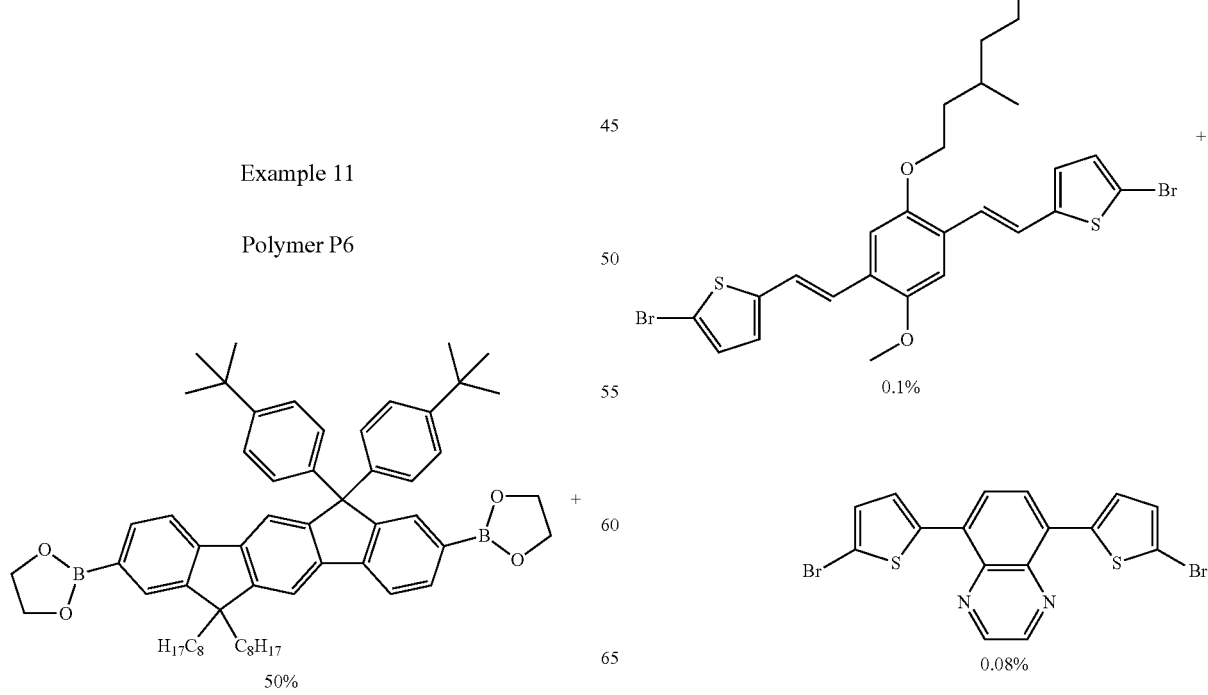

Comparative Example 12

Comparative Polymer C3

Comparative Example 13

Comparative Polymer C4

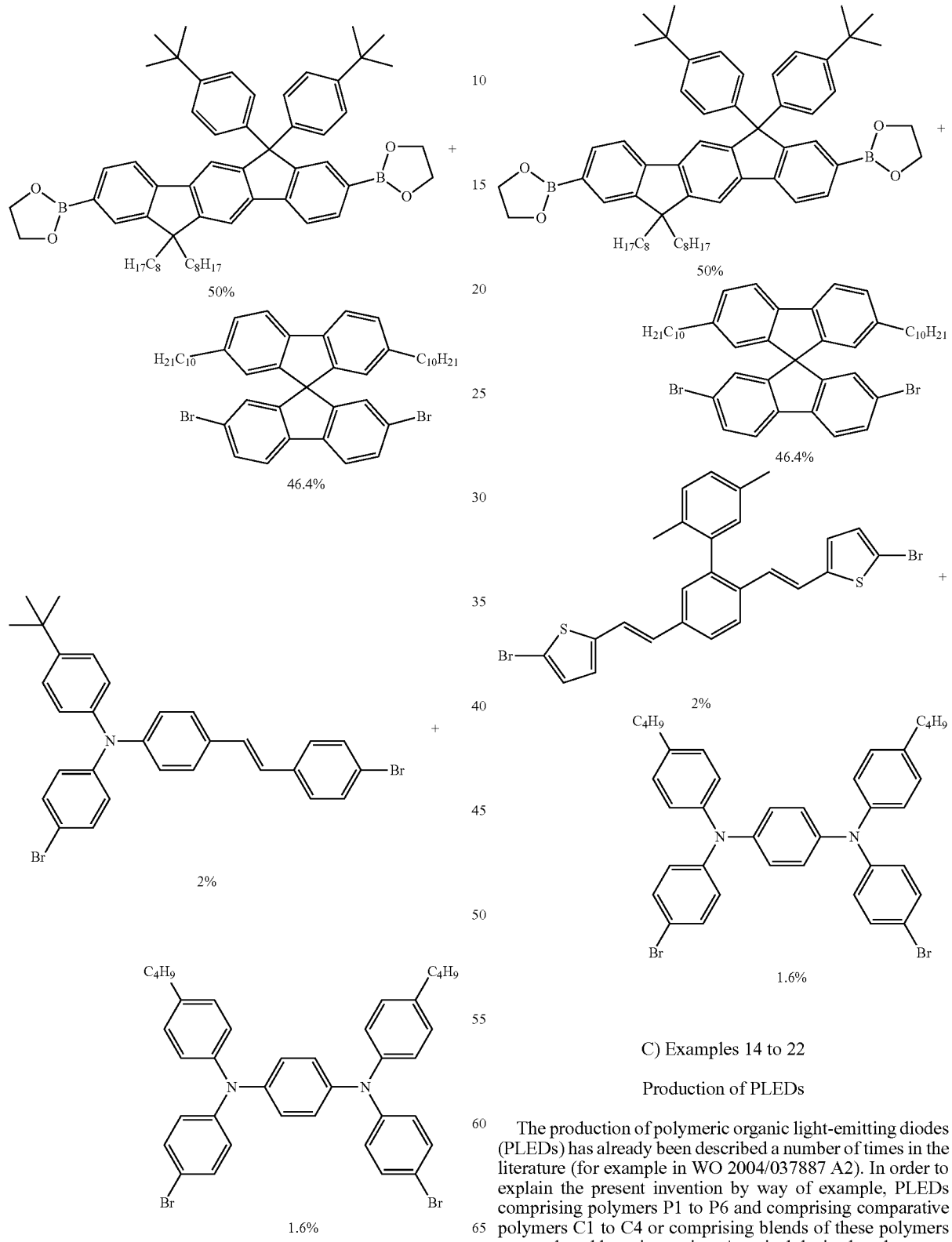

C) Examples 14 to 22

Production of PLEDs

The production of polymeric organic light-emitting diodes (PLEDs) has already been described a number of times in the literature (for example in WO 2004/037887 A2). In order to explain the present invention by way of example, PLEDs comprising polymers P1 to P6 and comprising comparative polymers C1 to C4 or comprising blends of these polymers are produced by spin coating. A typical device has the structure depicted in FIG. 1.

Figure 2:
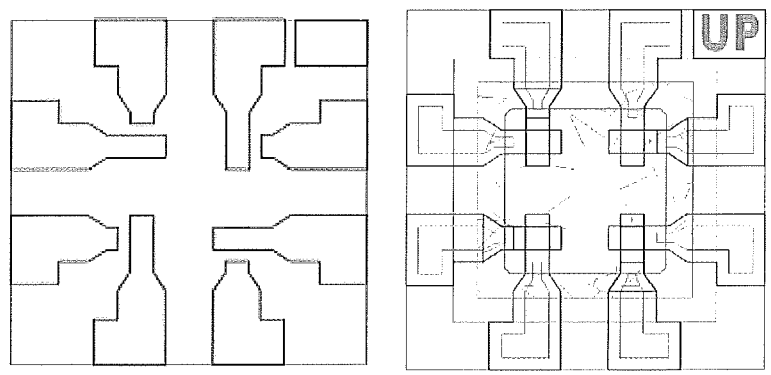
FIG. 2 illustrates specially manufactured substrates from Technoprint.

To this end, specially manufactured substrates from Technoprint are used in a layout designed specifically for this purpose (FIG. 2, left-hand figure: ITO structure applied to the glass support, right-hand figure: complete electronic structure with ITO, vapour-deposited cathode and optional metallisation of the leads). The ITO structure (indium tin oxide, a transparent, conductive anode) is applied to soda-lime glass by sputtering in a pattern such that 4 pixels measuring 2×2 mm are produced with the cathode applied by vapour deposition at the end of the production process.

The substrates are cleaned in a clean room with deionised water and a detergent (Deconex 15 PF) and then activated by a UV/ozone plasma treatment. An 80 nm layer of PEDOT (PEDOT is a polythiophene derivative (Baytron P VAI 4083sp.) from H.C. Starck, Goslar, which is supplied as an aqueous dispersion) is then applied by spin coating, likewise in a clean room. The spin rate necessary depends on the degree of dilution and the specific spin-coater geometry (typically for 80 nm: 4500 rpm). In order to remove residual water from the layer, the substrates are dried by heating on a hotplate at 180° C. for 10 minutes. After this, firstly 20 nm of an interlayer (typically a hole-dominated polymer, here HIL-012 from Merck) and then 65 nm of the polymer layers are applied from toluene solutions (concentration of interlayer 5 g/l, for polymers P1 to P6 and C1 to C4 between 8 and 10 g/l) under an inert-gas atmosphere (nitrogen or argon). The two layers are dried by heating at 180° C. for at least 10 minutes.

In a variation of this process, no individual polymers, but instead polymer blends are used in the emission layer. To this end, blend solutions are prepared by the following general method: for each component, a solution having the same concentration is prepared. To this end, a corresponding amount of the solid compound is weighed out and added to the corresponding amount of a suitable solvent. The mixture is then stirred for at least 1 hour until a clear solution has formed. For the preparation of the blend, the corresponding volumes of the solution are taken using a pipette and combined in a fresh vessel. For example, for the preparation of 10 ml of blend comprising 50% of component A and 50% of component B, a volume of 5 ml of component A (8 g/l) and a volume of 5 ml of component B (8 g/l) are combined. The solvent used can be, for example, toluene, which is employed here in all examples.

As an alternative to mixing solutions, a common solution of the polymers employed can also be prepared directly in the case of an adequate amount of solution (in order to guarantee weighing accuracy). Thus, blends having a composition of 37.5% of component A and 62.5% of component B are prepared by weighing out 3 g/l of component A and 5 g/l of component B.

After application of the polymer or polymer blend emission layer, the Ba/Al cathode is applied in the pattern indicated by vapour deposition through a vapour-deposition mask (high-purity metals from Aldrich, particularly barium 99.99% (order No. 474711); vapour-deposition units from Lesker or others, typical vacuum level $5 \times 10^{-6}$ mbar). Finally, the device is encapsulated in order to protect, in particular, the cathode against air and atmospheric moisture and is then characterised.

Figure 3:
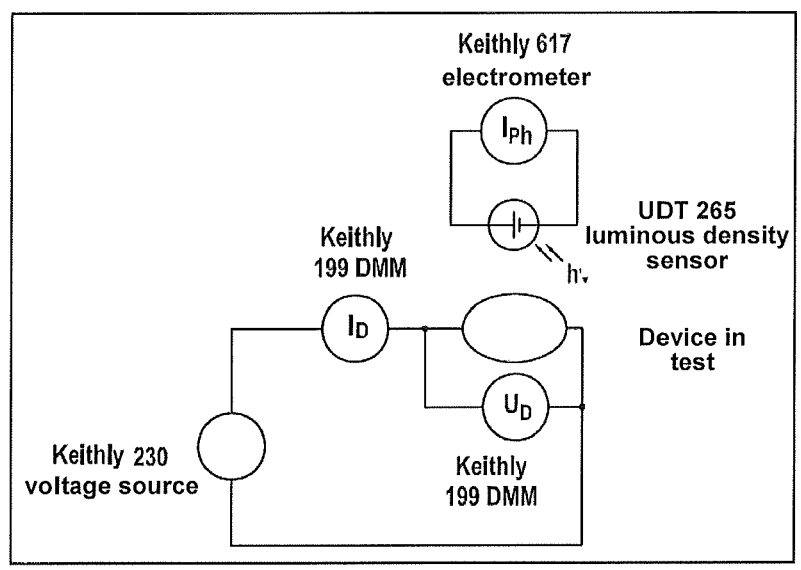
FIG. 3 illustrates the measurement set-up.

To this end, the devices are clamped into holders manufactured specifically for the substrate size and provided with spring contacts. A photodiode with eye response filter can be placed directly on the measurement holder in order to exclude influences from extraneous light. The typical measurement set-up is depicted in FIG. 3.

The voltages are typically increased from 0 to max. 20 V in 0.2 V steps and reduced again. For each measurement point, the current through the device and the photocurrent obtained are measured by the photodiode. In this way, the IUL data of the test devices are obtained. Important parameters are the maximum efficiency measured ("max. eff." in cd/A) and the voltage required for 100 cd/m$^2$.

In order, in addition, to determine the colour and the precise electroluminescence spectrum of the test devices, the voltage required for 100 mA/cm$^2$ is applied again after the first measurement, and the photodiode is replaced by a spectrum measurement head. This is connected to a spectrometer (Ocean Optics) by an optical fibre. The colour coordinates (CIE: Commission International de l'Éclairage, standard observer from 1931) can be derived from the measured spectrum.

Of particular importance for the usability of the materials is the lifetime of the devices. This is measured in a measurement set-up which is very similar to the first evaluation by establishing an initial luminous density (for example 1000 cd/m$^2$). The current required for this luminous density is kept constant, while, typically, the voltage increases and the luminous density decreases. The lifetime has been reached when the initial luminous density has dropped to 50% of the initial value.

The results obtained on use of polymers P1 to P6 and C1 to C4 and blends thereof in PLEDs are described in the Examples below. Examples 14 to 16 here relate to PLEDs comprising individual emitting polymers and Examples 17 to 22 relate to PLEDs comprising polymer blends.

Example 14

Comparison of Polymer P1 According to the Invention with Comparative Polymer C1a The results obtained on use of P1 and C1a in PLEDs are shown in Table 1. Both cases involve white-emitting polymers.

TABLE 1

| Polymer | U @ 100 cd/m$^2$ [V] | Max. eff. [cd/A] | Max. eff. [EQE] | Max. eff. [lm/W] | CIE [x/y] | Lifetime @1000 cd/m$^2$ [h] |
| --- | --- | --- | --- | --- | --- | --- |
| C1a | 7.1 | 7.6 | 3.7% | 3.7 | 0.32/0.38 | 1900 |
| P1 | 4.9 | 7.6 | 3.9% | 4.9 | 0.46/0.45 | 4000 |

As can be seen from the results, polymer P1 according to the invention represents a significant improvement over the comparable polymer in accordance with the prior art with respect to operating voltage, efficiency and lifetime.

Example 15

Comparison of Polymer P2 According to the Invention with Comparative Polymer C1a The results obtained on use of P2 and C1a in PLEDs are shown in Table 2. Both cases involve white-emitting polymers.

TABLE 2

| Polymer | U @ 100 cd/m² [V] | Max. eff. [cd/A] | Max. eff. [EQE] | Max. eff. [lm/W] | CIE [x/y] | Lifetime @1000 cd/m² [h] |
|---|---|---|---|---|---|---|
| C1a | 7.1 | 7.6 | 3.7% | 3.7 | 0.32/0.38 | 1900 |
| P2 | 4.2 | 8.4 | 4.1% | 6.4 | 0.39/0.44 | 3100 |

As can be seen from the results, polymer P2 according to the invention represents a significant improvement over the comparable polymer in accordance with the prior art with respect to operating voltage, efficiency and lifetime. Comparison of Examples P1 and P2 also shows how the colour can be matched to the particular requirements through the use of different monomers and concentrations.

Example 16

Comparison of Polymer P3 According to the Invention with Comparative Polymer C2

The results obtained on use of P3 and C2 in PLEDs are shown in Table 3. Both cases involve white-emitting polymers.

TABLE 3

| Polymer | U @ 100 cd/m² [V] | Max. eff. [cd/A] | Max. eff. [EQE] | Max. eff. [lm/W] | CIE [x/y] | Lifetime @1000 cd/m² [h] |
|---|---|---|---|---|---|---|
| C2 | 6.5 | 9.4 | 4.1% | 5.3 | 0.31/0.38 | 1900 |
| P3 | 4.1 | 11.7 | 4.6% | 8.0 | 0.41/0.49 | 1400 |

As can be seen from the results, polymer P3 according to the invention represents a significant improvement over the comparable polymer in accordance with the prior art with respect to operating voltage and efficiency.

Example 17

Comparison of a Blend According to the Invention of Polymer P1 and Comparative Polymer C2 with the Two Individual Components The results obtained on use of P1 and C2 and a 50:50 blend thereof in PLEDs are shown in Table 4. Both cases involve white-emitting polymers.

TABLE 4

| Polymer | U @ 100 cd/m² [V] | Max. eff. [cd/A] | Max. eff. [EQE] | Max. eff. [lm/W] | CIE [x/y] | Lifetime @1000 cd/m² [h] |
|---|---|---|---|---|---|---|
| C2 | 6.5 | 9.4 | 4.1% | 5.3 | 0.31/0.38 | 1900 |
| P1 | 4.9 | 7.6 | 3.9% | 4.9 | 0.46/0.45 | 4000 |
| P1 + C2 | 4.2 | 9.7 | 4.6% | 7.7 | 0.41/0.45 | 3800 |

As can be seen from the results, the performance data of a comparative polymer C2 corresponding to the prior art can be increased not only by the incorporation of monomers according to the invention (i.e. conversion into polymer P3 according to the invention, see Example 16). A further increase in the performance data can be achieved by the preparation of blends of the corresponding comparative polymer with a polymer according to the invention.

Example 18

Comparison of a Blend According to the Invention of Polymer P4 and Comparative Polymer C2 with the Two Individual Components The results obtained on use of P4 and C2 and a 38:62 blend thereof in PLEDs are shown in Table 5. A white-emitting comparative polymer and a blue-emitting polymer according to the invention are involved.

TABLE 5

| Polymer | U @ 100 cd/m² [V] | Max. eff. [cd/A] | Max. eff. [EQE] | Max. eff. [lm/W] | CIE [x/y] | Lifetime @1000 cd/m² [h] |
|---|---|---|---|---|---|---|
| C2 | 6.5 | 9.4 | 4.1% | 5.3 | 0.31/0.38 | 1900 |
| P4 | 4.1 | 7.1 | 3.3% | 5.3 | 0.20/0.35 | 200 |
| P4 + C2 | 3.2 | 14.0 | 5.6% | 12.4 | 0.32/0.42 | 3400 |

As can be seen from the results, a blend according to the invention of a comparative polymer C2 and a polymer P4 according to the invention is an order of magnitude superior to the comparative polymer corresponding to the prior art. This applies, in particular, to power efficiency and lifetime. This increase in the performance data can be achieved although particularly efficient or long-lifetime PLEDs cannot be produced from polymer P4 according to the invention (in contrast to polymers P1 to P3 according to the invention considered to date) as pure substance.

Example 19

Comparison of a Blend According to the Invention of Polymer P5 and Comparative Polymer C1a with the Two Individual Components The results obtained on use of P5 and C1a and a 38:62 blend thereof in PLEDs are shown in Table 6. A white-emitting comparative polymer and a blue-emitting polymer according to the invention are involved.

TABLE 6

| Polymer | U @ 100 cd/m² [V] | Max. eff. [cd/A] | Max. eff. [EQE] | Max. eff. [lm/W] | CIE [x/y] | Lifetime @1000 cd/m² [h] |
|---|---|---|---|---|---|---|
| C1a | 7.1 | 7.6 | 3.7% | 3.7 | 0.32/0.38 | 1900 |
| P5 | 4.5 | 1.8 | 0.9% | 1.1 | 0.15/0.32 | 20 |
| P5 + C1a | 4.2 | 10.6 | 5.0% | 8.2 | 0.34/0.41 | 3300 |

As can be seen from the results, a blend according to the invention of a comparative polymer C1a and a polymer P5 according to the invention is an order of magnitude superior to the comparative polymer corresponding to the prior art. This applies, in particular, to power efficiency and lifetime. This increase in the performance data can be achieved although particularly efficient or long-lifetime PLEDs cannot be produced from polymer P5 according to the invention (in contrast to polymers P1 to P3 according to the invention considered initially) as pure substance.

Example 20

Comparison of a Blend According to the Invention of Polymer P6 and Comparative Polymer C3 with the Two Individual Components The results obtained on use of P6 and C3 and a 50:50 blend thereof in PLEDs are shown in Table 7. A blue-emitting comparative polymer and a white-emitting polymer according to the invention are involved.

TABLE 7

| Polymer | U @ 100 cd/m$^2$ [V] | Max. eff. [cd/A] | Max. eff. [EQE] | Max. eff. [lm/W] | CIE [x/y] | Lifetime @1000 cd/m$^2$ [h] |
|---|---|---|---|---|---|---|
| P6 | 3.7 | 12.49 | 4.8% | 8.8 | 0.41/0.48 | 2400 |
| C3 | 5.6 | 6.1 | 4.1% | 4.0 | 0.15/0.19 | 600 |
| P6 + C3 | 3.3 | 13.52 | 5.3% | 11.4 | 0.37/0.46 | 5300 |

As can be seen from the results, the performance data of a polymer P6 according to the invention can be further increased by using it not as the pure substance, but instead as a component of a blend according to the invention (with a comparative polymer C3). This applies, in particular, to the lifetime and power efficiency, but also to the quantum efficiency and operating voltage.

Example 21

Comparison of a Blend According to the Invention of Polymer P5 and Comparative Polymer C4 with the Two Individual Components The results obtained on use of P5 and C4 and a 50:50 blend thereof in PLEDs are shown in Table 8. A green-emitting comparative polymer and a blue-emitting polymer according to the invention are involved.

TABLE 8

| Polymer | U @ 100 cd/m$^2$ [V] | Max. eff. [cd/A] | Max. eff. [EQE] | Max. eff. [lm/W] | CIE [x/y] | Lifetime @1000 cd/m$^2$ [h] |
|---|---|---|---|---|---|---|
| C4 | 6.4 | 15.1 | 4.6% | 8.5 | 0.32/0.59 | 9200 |
| P5 | 4.5 | 1.8 | 0.9% | 1.1 | 0.15/0.32 | 20 |
| P5 + C4 | 3.2 | 16.1 | 5.2% | 13.1 | 0.29/0.56 | 10300 |

As can be seen from the results, a blend according to the invention of a comparative polymer C4 and a polymer P5 according to the invention is clearly superior to the comparative polymer corresponding to the prior art. This applies, in particular, to power efficiency and operating voltage. This increase in the performance data can be achieved although particularly efficient or long-lifetime PLEDs cannot be produced from polymer P5 according to the invention (in contrast to polymers P1 to P3 according to the invention considered initially) as the pure substance.

Example 22

Comparison of a Blend According to the Invention of Polymer P5 and Comparative Polymer C1b with the Two Individual Components The results obtained on use of P5 and C1b and a 50:50 blend thereof in PLEDs are shown in Table 9. A red-emitting comparative polymer and a blue-emitting polymer according to the invention are involved.

TABLE 9

| Polymer | U @ 100 cd/m$^2$ [V] | Max. eff. [cd/A] | Max. eff. [EQE] | Max. eff. [lm/W] | CIE [x/y] | Lifetime @1000 cd/m$^2$ [h] |
|---|---|---|---|---|---|---|
| C1b | 12 | 0.7 | 0.7 | 0.18 | 0.63/0.35 | NA |
| P5 | 4.5 | 1.8 | 0.9 | 1.1 | 0.15/0.32 | 20 |
| P5 + C1b | 6.1 | 3.0 | 2.6 | 1.4 | 0.61/0.37 | 11000 |

As can be seen from the results, a blend according to the invention of a comparative polymer C1b and a polymer P5 according to the invention is significantly better than C1b alone. Owing to the red emitter used and the resultant poor efficiency, it was not possible to measure a lifetime. However, the mixture according to the invention of the two materials results in a good red singlet polymer (typical efficiencies) having a very good lifetime.

The invention claimed is:

1. A polymer comprising at least one structural unit of the general formula (I)

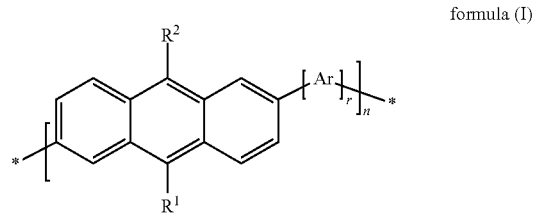

formula (I)

where the following applies to the symbols and indices used:

Ar is an aryl, aryloxy, heteroaryl or heteroaryloxy group or an aromatic or heteroaromatic ring system, $R^1$ and $R^2$ are each, independently of one another, $Ar^1$, H, D, F, Cl, Br, I, $N(Ar^2)_2$, $C(=O)Ar^2$, $P(=O)Ar^2_2$, $S(=O)Ar^2$, $S(=O)_2Ar^2$, $CR^3=CR^3Ar^2$, CN, $NO_2$, $Si(R^3)_3$, $B(OR^3)_2$, $OSO_2R^3$, a straight-chain alkyl, alkoxy or thioalkoxy group having 1 to 40 C atoms or a branched or cyclic alkyl, alkoxy or thioalkoxy group having 3 to 40 C atoms, each of which optionally is substituted by one or more radicals $R^3$, where one or more non-adjacent $CH_2$ groups optionally is replaced by $R^3C=CR^3$, $C\equiv C$, $Si(R^3)_2$, $Ge(R^3)_2$, $Sn(R^3)_2$, $C=O$, $C=S$, $C=Se$, $C=NR^3$, $P(=O)(R^3)$, SO, $SO_2$, $NR^3$, O, S or $CONR^3$ and where one or more H atoms optionally is replaced by F, Cl, Br, I, CN or $NO_2$, $Ar^1$ is selected on each occurrence, in each case independently of one another, from an aryl or heteroaryl group or an aromatic or heteroaromatic ring system, $Ar^2$ is an aryl, aryloxy, heteroaryl or heteroaryloxy group, $R^3$ is in each case, independently of one another, H or an aliphatic or aromatic hydrocarbon radical having 1 to 20 C atoms, where furthermore, if $R^1$ and $R^2$ both denote a radical $Ar^1$, the compound of the formula (I) is then selected from the structures of the formulae (Ia), (Ib), (Ic) and (Id):

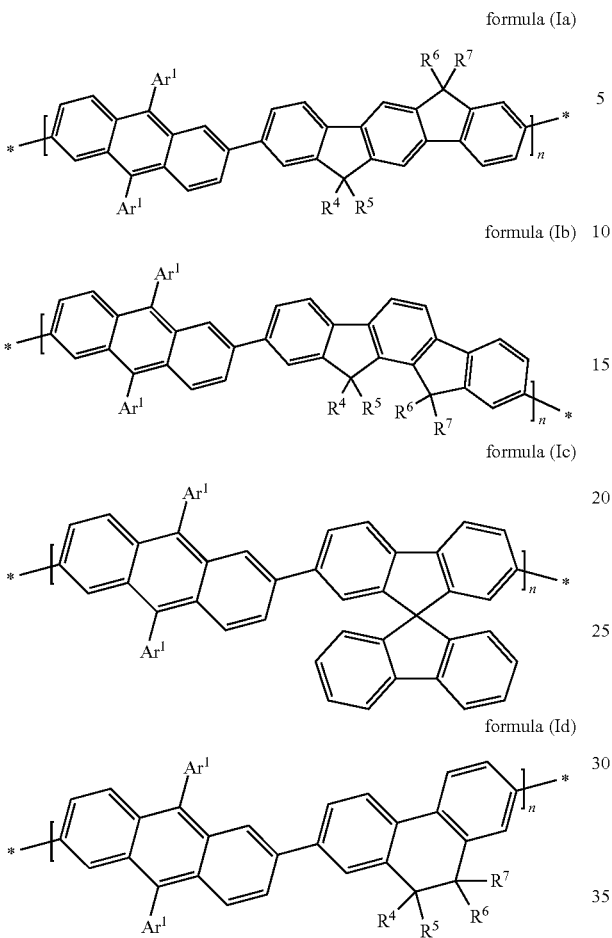

formula (Ia)

formula (Ib)

formula (Ic)

formula (Id)

where $Ar^1$ is on each occurrence identical or different, $R^4$, $R^5$, $R^6$ and $R^7$ each, independently of one another, have the meaning indicated for $R^1$, where $n \geq 1$ and $r=1$, and where the bonds denoted by an asterisk represent the bonds to the adjacent structural units in the polymer.

2. The polymer according to claim 1, wherein, in the general formula (I), at least one representative from $R^1$ and $R^2$ does not denote $Ar^1$ and Ar is one of the formula (1) to (20)

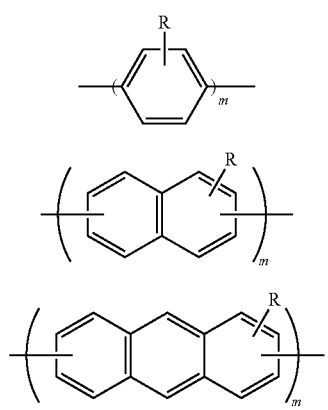

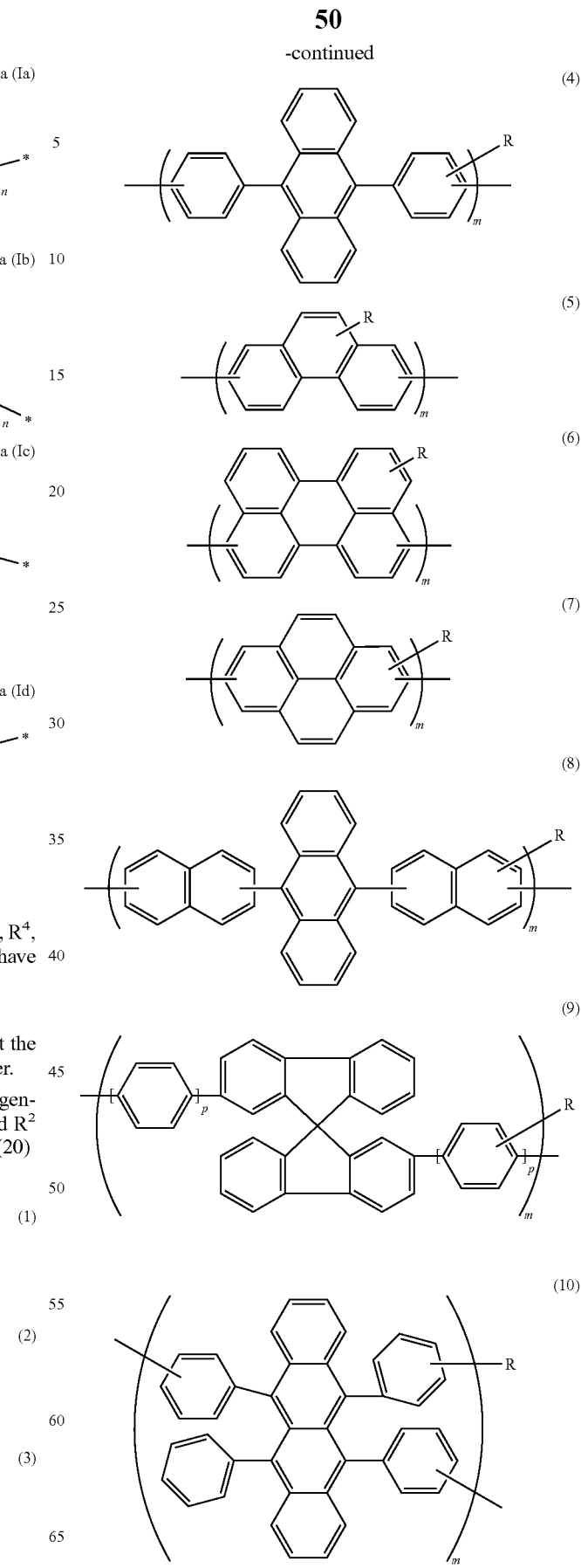

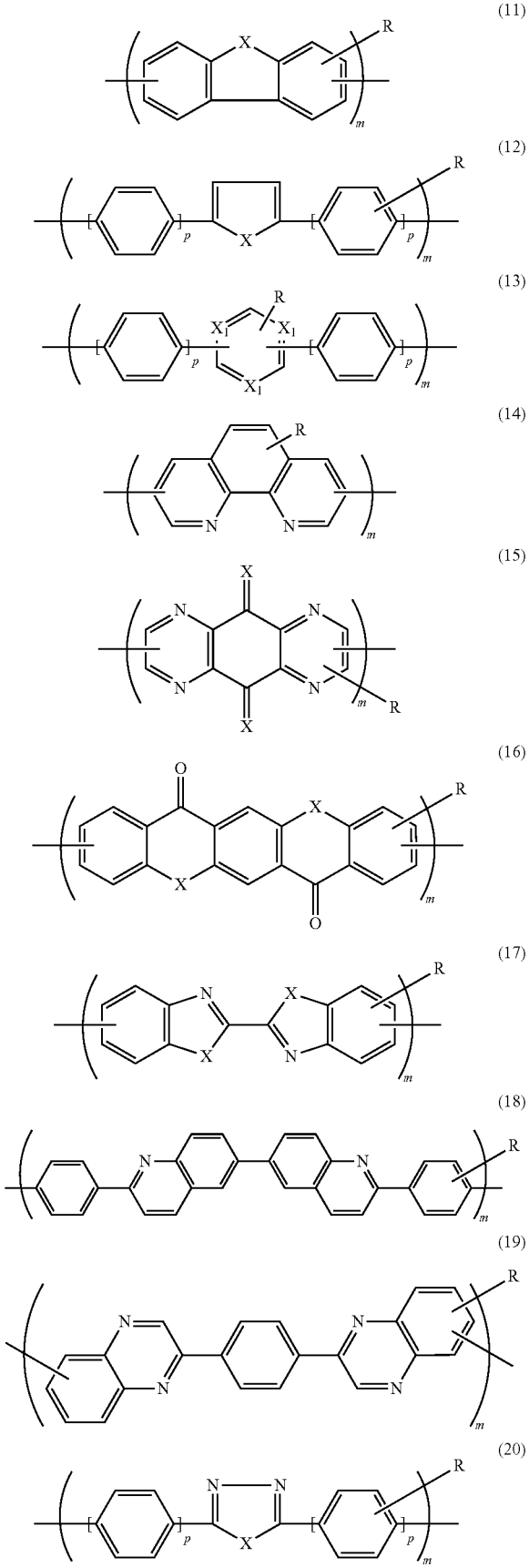

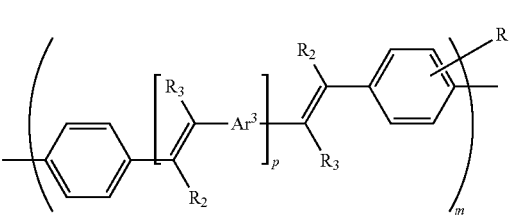

where R, $R_1$, $R_2$ and $R_3$ have the meanings indicated for $R^1$ and $R^2$ in claim 1, Ar$^3$ is an aromatic or heteroaromatic group, m is equal to 1 to 4, p is, independently of one another, identically or differently, 0 to 2, X is equal to $NR^1$, O or S, and $X_1$ is equal to N or CH.

3. The polymer according to claim 1, wherein Ar$^1$ is on each occurrence, in each case independently of one another, from phenyl, naphthyl, anthracenyl, phenanthrenyl, pyrenyl, chrysenyl, perylenyl, fluoranthenyl, naphthacenyl, pentacenyl, benzopyrenyl, biphenyl, biphenylenyl, terphenyl, terphenylenyl, fluorenyl, spirobifluorenyl, dihydrophenanthrenyl, dihydropyrenyl, tetrahydropyrenyl, cis- or trans-indenofluorenyl, truxenyl, isotruxenyl, spirotruxenyl, spiroisotruxenyl, furanyl, benzofuranyl, isobenzofuranyl, dibenzofuranyl, thiophenyl, benzothiophenyl, isobenzothiophenyl, dibenzothiophenyl, pyrrolyl, indolyl, isoindolyl, carbazolyl, pyridinyl, quinolinyl, isoquinolinyl, acridinyl, phenanthridinyl, benzo-5,6-quinolinyl, benzo-6,7-quinolinyl, benzo-7,8-quinolinyl, phenothiazinyl, phenoxazinyl, pyrazolyl, indazolyl, imidazolyl, benzimidazolyl, naphthimidazolyl, phenanthrimidazolyl, pyridimidazolyl, pyrazinimidazolyl, quinoxalinimidazolyl, oxazolyl, benzoxazolyl, naphthoxazolyl, anthroxazolyl, phenanthroxazolyl, isoxazolyl, 1,2-thiazolyl, 1,3-thiazolyl, benzothiazolyl, pyridazinyl, benzopyridazinyl, pyrimidinyl, benzopyrimidinyl, quinoxalinyl, 1,5-diaza-anthracenyl, 2,7-diazapyrenyl, 2,3-diazapyrenyl, 1,6-diazapyrenyl, 1,8-diazapyrenyl, 4,5-diazapyrenyl, 4,5,9,10-tetraazaperylenyl, pyrazinyl, phenazinyl, phenoxazinyl, phenothiazinyl, fluorubinyl, naphthyridinyl, azacarbazolyl, benzocarbolinyl, phen-anthrolinyl, 1,2,3-triazolyl, 1,2,4-triazolyl, benzotriazolyl, 1,2,3-oxadiazolyl, 1,2,4-oxadiazolyl, 1,2,5-oxadiazolyl, 1,3,4-oxadiazolyl, 1,2,3-thiadiazolyl, 1,2,4-thiadiazolyl, 1,2,5-thiadiazolyl, 1,3,4-thiadiazolyl, 1,3,5-triazinyl, 1,2,4-triazinyl, 1,2,3-triazinyl, tetrazolyl, 1,2,4,5-tetrazinyl, 1,2,3,4-tetrazinyl, 1,2,3,5-tetrazinyl, purinyl, pteridinyl, indolizinyl, benzothiadiazolyl, benzanthrenyl, benzanthracenyl, rubicenyl or triphenylenyl.

4. The polymer according to claim 1, wherein Ar$^1$ is substituted by one or more linear, branched or cyclic alkyl or alkoxy radicals.

5. The polymer according to claim 1, wherein the polymer comprises further structural units which are different from the structural unit of the formula (I).

6. The polymer according to claim 5, wherein the further structural units are a hole-injection, hole-transport, hole-blocking, electron-injection, electron-transport, electron-blocking, emitter, exciton-generating unit, a backbone unit or combinations thereof.

7. A blend comprising a polymer comprising one or more structural units of the general formula (II)

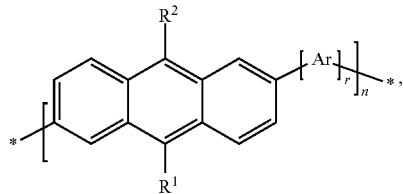

formula (II)

and a further, different polymer, oligomer, dendrimer or a low-molecular-weight compound, where the following applies to the symbols and indices used:

Ar is an aryl, aryloxy, heteroaryl or heteroaryloxy group or an aromatic or heteroaromatic ring system, $R^1$ and $R^2$ are each, independently of one another, $Ar^1$, H, D, F, Cl, Br, I, $N(Ar^2)_2$, $C(=O)Ar^2$, $P(=O)Ar^2_2$, $S(=O)Ar^2$, $S(=O)_2Ar^2$, $CR^3=CR^3Ar^2$, CN, $NO_2$, $Si(R^3)_3$, $B(OR^3)_2$, $OSO_2R^3$, a straight-chain alkyl, alkoxy or thioalkoxy group having 1 to 40 C atoms or a branched or cyclic alkyl, alkoxy or thioalkoxy group having 3 to 40 C atoms, each of which optionally is substituted by one or more radicals $R^3$, where one or more non-adjacent $CH_2$ groups optionally is replaced by $R^3C=CR^3$, $C≡C$, $Si(R^3)_2$, $Ge(R^3)_2$, $Sn(R^3)_2$, C=O, C=S, C=Se, $C=NR^3$, $P(=O)(R^3)$, SO, $SO_2$, $NR^3$, O, S or $CONR^3$ and where one or more H atoms optionally is replaced by F, Cl, Br, I, CN or $NO_2$, $Ar^1$ is selected on each occurrence, in each case independently of one another, from an aryl or heteroaryl group or an aromatic or heteroaromatic ring system, $Ar^2$ is an aryl, aryloxy, heteroaryl or heteroaryloxy group, $R^3$ is in each case, independently of one another, H or an aliphatic or aromatic hydrocarbon radical having 1 to 20 C atoms, n is ≥1 and r is 0 or 1, and where the bonds denoted by an asterisk represent the bonds to the adjacent structural units in the polymer.

8. The blend according to claim 7, wherein $R^1$ and $R^2$ denote a radical $Ar^1$ and r=0.

9. The blend according to claim 7, wherein $Ar^1$ is phenyl, naphthyl, anthracenyl, phenanthrenyl, pyrenyl, chrysenyl, perylenyl, fluoranthenyl, naphthacenyl, pentacenyl, benzopyrenyl, biphenyl, biphenylenyl, terphenyl, terphenylenyl, fluorenyl, spirobifluorenyl, dihydrophenanthrenyl, dihydropyrenyl, tetrahydropyrenyl, cis- or trans-indenofluorenyl, truxenyl, isotruxenyl, spirotruxenyl, spiroisotruxenyl, furanyl, benzofuranyl, isobenzofuranyl, dibenzofuranyl, thiophenyl, benzothiophenyl, isobenzothiophenyl, dibenzothiophenyl, pyrrolyl, indolyl, isoindolyl, carbazolyl, pyridinyl, quinolinyl, isoquinolinyl, acridinyl, phenanthridinyl, benzo-5,6-quinolinyl, benzo-6,7-quinolinyl, benzo-7,8-quinolinyl, phenothiazinyl, phenoxazinyl, pyrazolyl, indazolyl, imidazolyl, benzimidazolyl, naphthimidazolyl, phenanthrimidazolyl, pyridimidazolyl, pyrazinimidazolyl, quinoxalinimidazolyl, oxazolyl, benzoxazolyl, naphthoxazolyl, anthroxazolyl, phenanthroxazolyl, isoxazolyl, 1,2-thiazolyl, 1,3-thiazolyl, benzothiazolyl, pyridazinyl, benzopyridazinyl, pyrimidinyl, benzopyrimidinyl, quinoxalinyl, 1,5-diazaanthracenyl, 2,7-diazapyrenyl, 2,3-diazapyrenyl, 1,6-diazapyrenyl, 1,8-diazapyrenyl, 4,5-diazapyrenyl, 4,5,9,10-tetraazaperylenyl, pyrazinyl, phenazinyl, phenoxazinyl, phenothiazinyl, fluorubinyl, naphthyridinyl, azacarbazolyl, benzo-carbolinyl, phenanthrolinyl, 1,2,3-triazolyl, 1,2,4-triazolyl, benzotriazolyl, 1,2,3-oxa-diazolyl, 1,2,4-oxadiazolyl, 1,2,5-oxadiazolyl, 1,3,4-oxadiazolyl, 1,2,3-thiadiazolyl, 1,2,4-thiadiazolyl, 1,2,5-thiadiazolyl, 1,3,4-thiadiazolyl, 1,3,5-triazinyl, 1,2,4-triazinyl, 1,2,3-triazinyl, tetrazolyl, 1,2,4,5-tetrazinyl, 1,2,3,4-tetrazinyl, 1,2,3,5-tetrazinyl, purinyl, pteridinyl, indolizinyl, benzothiadiazolyl, benzanthrenyl, benzanthracenyl, rubicenyl or triphenylenyl.

10. A blend which comprises the polymer according to claim 1 and a further, different polymer, oligomer, dendrimer or a low-molecular-weight compound.

11. An organic electronic device which comprises the polymer according to claim 1.

12. A formulation comprising the polymer according to claim 1 and one or more solvents.

13. A formulation comprising the blend according to claim 7 and one or more solvents.

14. An organic electronic device comprising one or more layers, where at least one layer comprises the polymer according to claim 1.

15. An organic electronic device comprising one or more layers, where at least one layer comprises the blend according to claim 7.

16. The organic electronic device according to claim 13, wherein the layers are selected from one or more hole-injection, hole-transport, hole-blocking, electron-injection, electron-transport, electron-blocking, charge-generation or emitter layers, a layer which comprises exciton-generating units, or combinations thereof.

17. The organic electronic device according to claim 14, wherein the electronic device is an organic electroluminescent device (OLED), a polymeric electroluminescent device (PLED), an organic integrated circuit (O-IC), an organic field-effect transistor (O-FET), an organic thin-film transistor (O-TFT), an organic light-emitting transistor (O-LET), an organic solar cell (O-SC), an organic optical detector, an organic photoreceptor, an organic field-quench device (O-FQD), a light-emitting electrochemical cell (LEC) or an organic laser diode (O-laser).

* * * * *